(12) United States Patent
Okutsu

(10) Patent No.: US 8,755,181 B2
(45) Date of Patent: *Jun. 17, 2014

(54) ELECTRONIC DEVICE

(71) Applicant: Kabushiki Kaisha Toshiba, Tokyo (JP)

(72) Inventor: Isao Okutsu, Akishima-shi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/777,763

(22) Filed: Feb. 26, 2013

(65) Prior Publication Data

US 2013/0176668 A1    Jul. 11, 2013

Related U.S. Application Data

(63) Continuation of application No. 13/283,383, filed on Oct. 27, 2011, now Pat. No. 8,405,978.

(30) Foreign Application Priority Data

Feb. 24, 2011   (JP) ................................. 2011-038599

(51) Int. Cl.
    *G06F 1/16*         (2006.01)
(52) U.S. Cl.
    USPC ...... 361/679.55; 16/165; 439/349; 455/575.3
(58) Field of Classification Search
    USPC ............ 16/326, 330, 307, 348, 284, 165, 31,
            16/529; 361/807, 810, 697, 679.55,
            361/679.08, 679.01, 679.29, 679.09,
            361/679.33, 679.48, 679.21, 679.28,
        361/679.04, 679.6, 679.27, 679.32, 679.41;
            439/131, 49, 349; 416/13, 23;
            455/41.2, 78, 575.3, 575.1, 41.3;
            345/1.3, 173
    See application file for complete search history.

(56) References Cited

U.S. PATENT DOCUMENTS 7,706,137 B2    4/2010   Iijima et al.
7,832,056 B2   11/2010   Kuwajima et al.
            (Continued)

FOREIGN PATENT DOCUMENTS

JP    03-067714    7/1991
JP    H03-241792   10/1991
            (Continued)

OTHER PUBLICATIONS

Office Action mailed by JPO on Jan. 24, 2012 in Japanese Application 2011-038599 and an English translation thereof in a total of seven (7) pages.

(Continued)

*Primary Examiner* — Hung Duong
(74) *Attorney, Agent, or Firm* — Knobbe, Martens, Olson & Bear LLP

(57) ABSTRACT

According to one embodiment, an electronic device includes: a first housing; a second housing; and a connector. The first housing includes a first face and a first periphery portion provided along a periphery of the first face. The second housing includes a second face and a second periphery portion provided along a periphery of the second face and positioned near the first periphery portion. The connector includes a first portion connected to the first housing and a second portion connected to the second housing. The connector rotatably connects the first housing and the second housing with each other. The connector permits a change in a distance between the first portion and the second portion to prevent a change in a distance between the first periphery portion and the second periphery portion when the first housing and the second housing are rotated with respect to each other.

6 Claims, 18 Drawing Sheets

(56) References Cited

U.S. PATENT DOCUMENTS

| | | |
|---|---|---|
| 8,264,829 B2 | 9/2012 | Moser |
| 8,405,978 B2 * | 3/2013 | Okutsu .................. 361/679.55 |
| 2005/0050686 A1 | 3/2005 | Kurokawa |
| 2009/0000062 A1 | 1/2009 | Yamanami |
| 2011/0310540 A1 | 12/2011 | Hashimoto et al. |
| 2012/0212924 A1 | 8/2012 | Nakajima |
| 2012/0218690 A1 | 8/2012 | Okutsu |
| 2012/0218732 A1 | 8/2012 | Minemura et al. |
| 2012/0223872 A1 * | 9/2012 | Ram ............................ 345/1.3 |
| 2013/0169564 A1 * | 7/2013 | Sano et al. .................... 345/173 |

FOREIGN PATENT DOCUMENTS

| | | |
|---|---|---|
| JP | H4-051585 | 4/1992 |
| JP | 05-030918 | 4/1993 |
| JP | 05-197444 | 8/1993 |
| JP | 11-175188 | 7/1999 |
| JP | 2005-023955 | 1/2005 |
| JP | 2005-266968 | 9/2005 |
| JP | 2005-299114 | 10/2005 |
| JP | 2007-198416 | 8/2007 |
| JP | 2008-075747 | 4/2008 |
| JP | 2008-144962 | 6/2008 |
| JP | 2008-215365 | 9/2008 |
| JP | 2009-015386 | 1/2009 |
| JP | 2009-222079 | 10/2009 |
| JP | 2010-039971 | 2/2010 |
| JP | 2010-078112 | 4/2010 |
| WO | WO 2006/129555 | 12/2006 |
| WO | WO 2010/028404 | 3/2010 |

OTHER PUBLICATIONS

Decision to Grant Patent mailed by the JPO on Jun. 12, 2012 in Japanese Application 2011-038599 and an English translation thereof in a total of five (5) pages.

Japanese Office Action for corresponding Japanese Application No. 2012-150734, mailed May 28, 2013, in 5 pages.

* cited by examiner

ELECTRONIC DEVICE

CROSS-REFERENCE TO RELATED APPLICATIONS

This application is a continuation of U.S. patent application Ser. No. 13/283,383, filed on Oct. 27, 2011, which is based upon and claims the benefit of priority from Japanese Patent Application No. 2011-038599, filed on Feb. 24, 2011, the entire contents of these applications are incorporated herein by reference.

FIELD

Embodiments described herein relate generally to an electronic device.

BACKGROUND

Conventionally, there is known an electronic device comprising two housings rotatably connected to each other, and capable of being changed between an folded position in which the housings are folded (closed) and an unfolded position in which the housings are unfolded (opened).

For such electronic device, under some circumstances, it is desired that peripheries of the housings are made close to each other.

BRIEF DESCRIPTION OF THE SEVERAL VIEWS OF THE DRAWINGS

A general architecture that implements the various features of the invention will now be described with reference to the drawings. The drawings and the associated descriptions are provided to illustrate embodiments of the invention and not to limit the scope of the invention.

DETAILED DESCRIPTION

Figure 1:
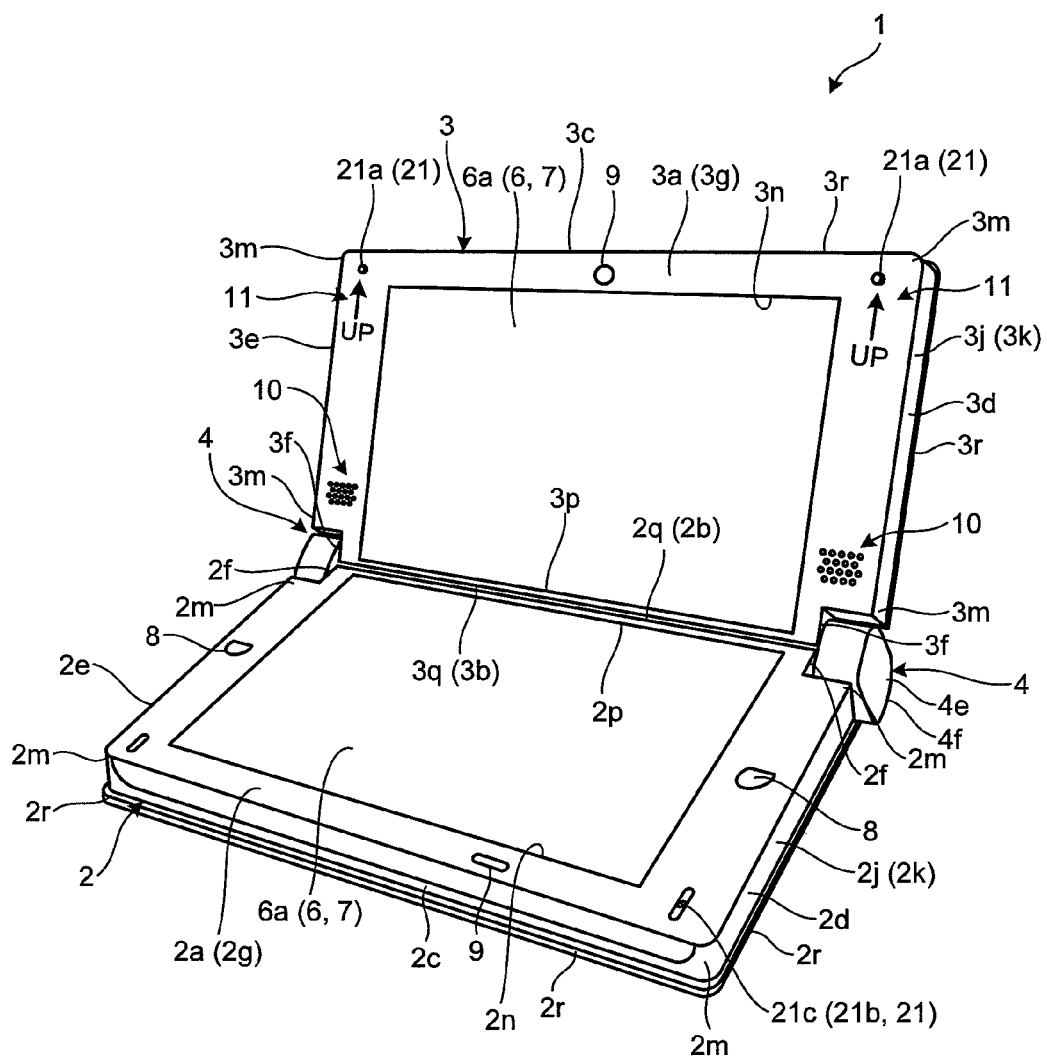
FIG. 1 is an exemplary perspective view of an electronic device in an unfolded position according to an embodiment.

In general, according to one embodiment, an electronic device comprises: a first display device; a first housing; a second display device; a second housing; and a connector. The first display device comprises a first display screen. The first housing comprises a first face and a first periphery portion, and is configured to house therein the first display device. The first face is provided with a first opening through which the first display screen is exposed. The first periphery portion is provided along a periphery of the first face. The second display device comprises a second display screen. The second housing comprises a second face and a second periphery portion, and is configured to house therein the second display device. The second face is provided with a second opening through which the second display screen is exposed. The second periphery portion is provided along a periphery of the second face and is positioned near the first periphery portion. The connector comprises a first portion connected to the first housing and a second portion connected to the second housing. The connector is configured to rotatably connect the first housing and the second housing with each other. The connector is configured to permit a change in a distance between the first portion and the second portion to prevent a change in a distance between the first periphery portion and the second periphery portion when the first housing and the second housing are rotated with respect to each other.

Following embodiments contain similar elements. Thus, in the following, the same reference numerals are attached to the same elements, and the explanations thereof are omitted.

Figure 2:
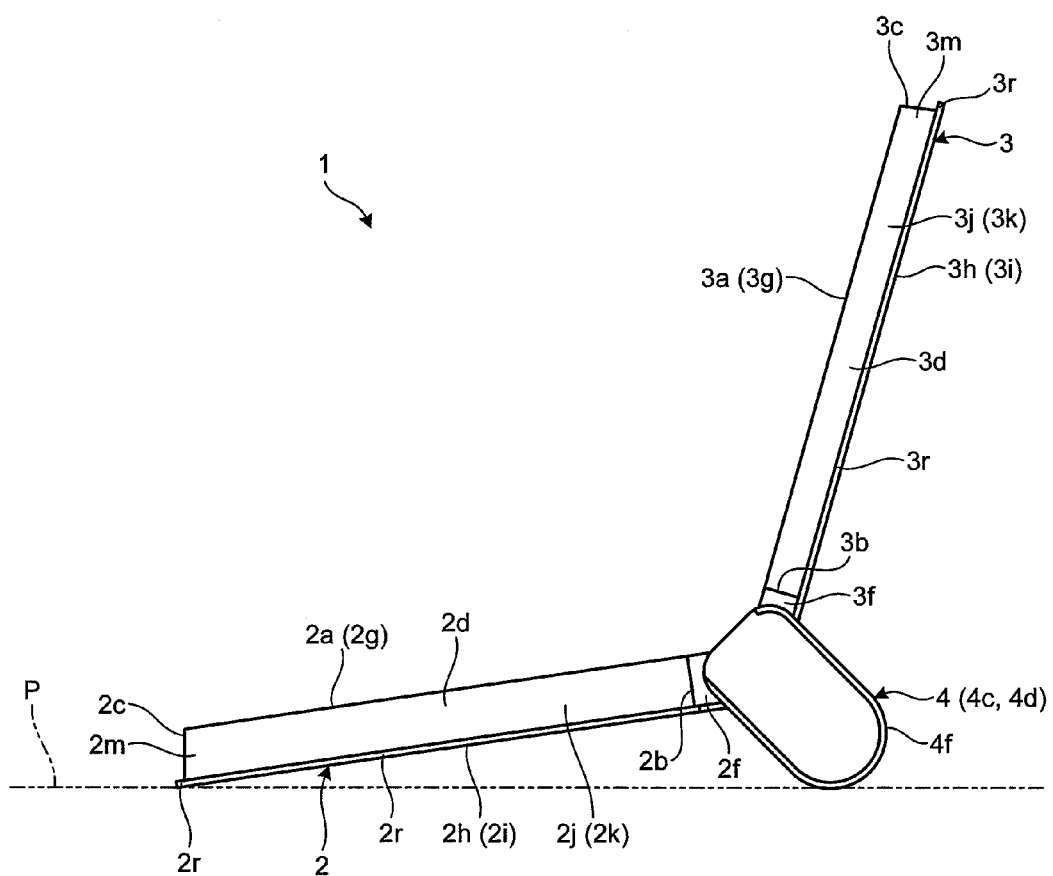
FIG. 2 is an exemplary side view of the electronic device in the unfolded position in the first embodiment.
Figure 3:
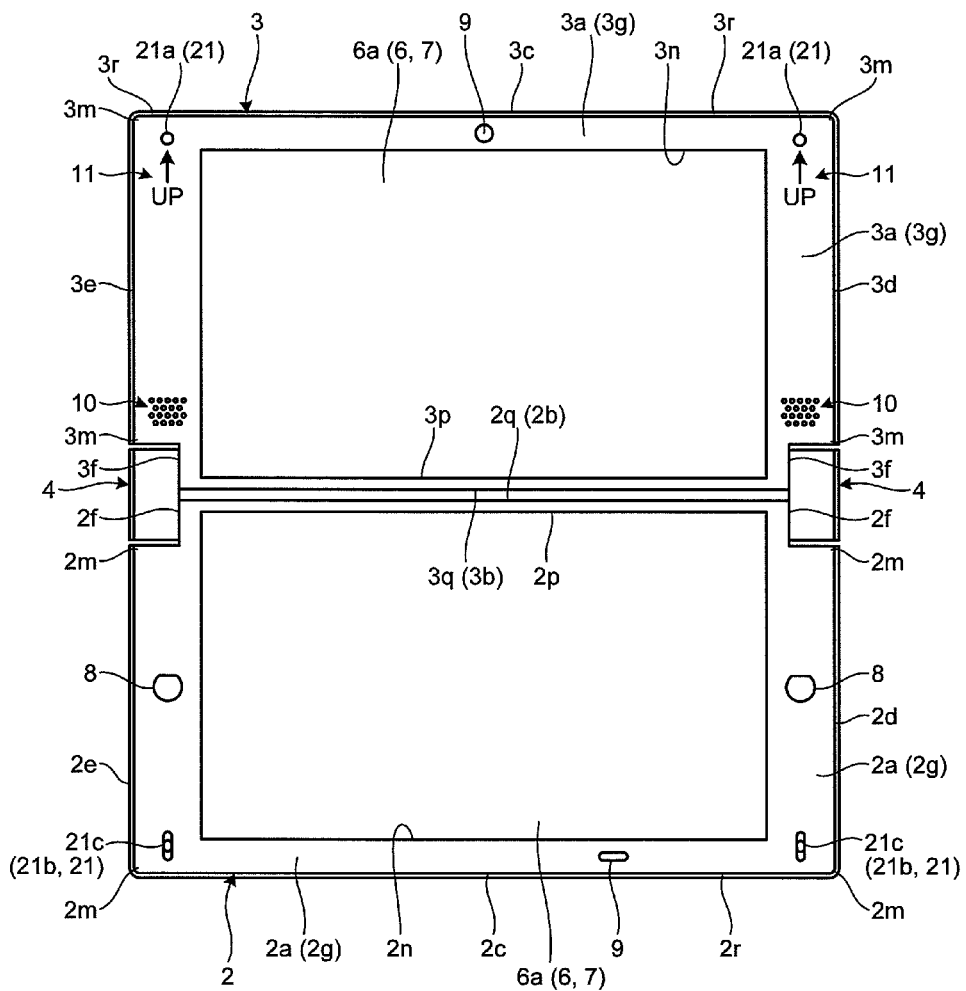
FIG. 3 is an exemplary plan view of the electronic device in the unfolded position in the first embodiment.
Figure 4:
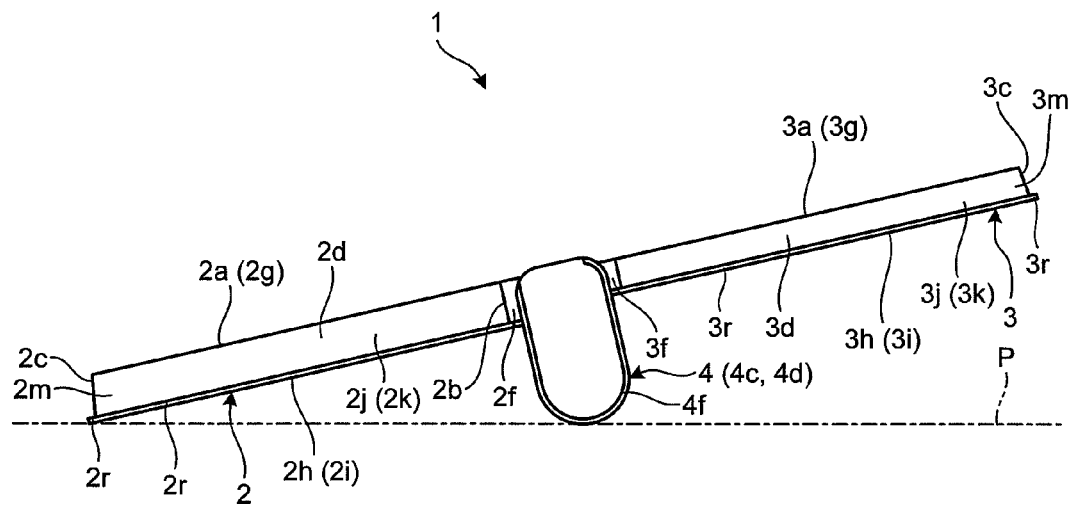
FIG. 4 is another exemplary side view of the electronic device in the unfolded position in the first embodiment.

As illustrated in FIG. 1 and the like, an electronic device 1 according to a first embodiment is configured as a so-called notebook personal computer (PC). The electronic device 1 comprises: a flat rectangular first housing (housing, first portion) 2; and a flat rectangular second housing (housing, second portion) 3. The first housing 2 and the second housing 3 are connected to each other via a connector (third housing, third portion) 4 so as to be rotatable with respect to each other (movable with respect to each other) between their unfolded position illustrated in FIGS. 1 to 4 and the like and an folded position illustrated in FIGS. 5 and 6 and the like. As illustrated in FIGS. 3, 4, and the like, in the unfolded position in which the first housing 2 and the second housing 3 are unfolded at maximum angle (180°), a face (front face, surface) 2a of the first housing 2 and a face (front face, surface) 3a of the second housing 3 form a substantially flat plane. On the other hand, in the folded state, the face 2a of the housing 2 and the face 3a of the second housing 3 are placed close to each other and oppose each other, as in FIG. 5.

In the first embodiment, an end portion (side portion) 2b and an end portion (side portion) 3b are located close to each other and in parallel to each other, regardless of an angle between the first housing 2 and the second housing 3 when they are folded. That is to say, the end portion 2b and the end portion 3b are positioned close to each other and in parallel to each other in the folded and unfolded positions at various angles as illustrated in FIGS. 1 to 6 and the like. Here, the end portion 2b is a portion at a periphery of the first housing 2, and the end portion 3b is a portion at a periphery of the second housing 3. Therefore, in the first embodiment, the first housing 2 and the second housing 3 are rotatably connected to each other such that the end portions 2b, 3b become back ends and end portions 2c, 3c opposite the end portions 2b, 3b, respectively, become front ends. In the embodiment, the end portion 2b is one example of a first end portion, and the end portion 3b is one example of a second end portion.

A hinge mechanism (connector, hinge, rotating and connecting portion) 5 rotatably connecting the first housing 2 and the second housing 3 with each other is housed in a housing 4e of the connector 4. The hinge mechanism 5 (see FIG. 10) rotatably connects the back ends of the first housing 2 and the second housing 3 with each other, or in other words, rotatably connects the end portions 2b, 3b with each other. The housing 4e of the connector 4 is one example of a cover of the hinge mechanism 5.

Figure 5:
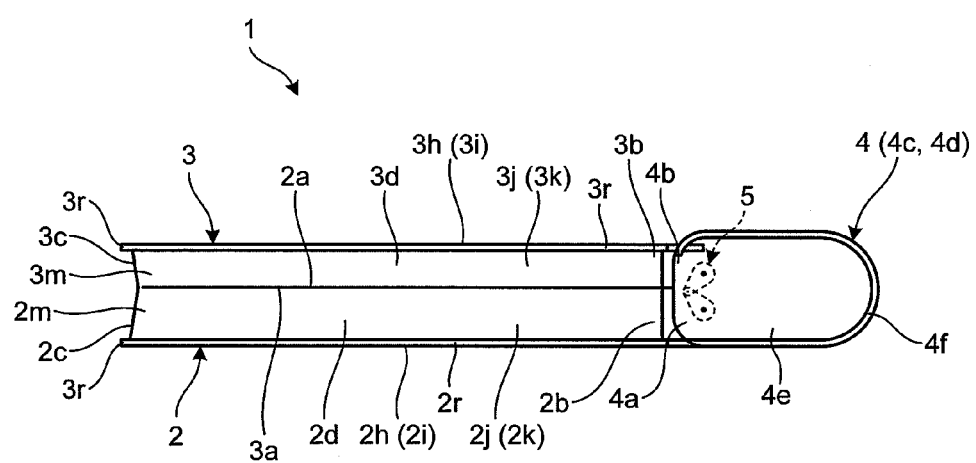
FIG. 5 is an exemplary side view of the electronic device in a folded position in the first embodiment.
Figure 6:
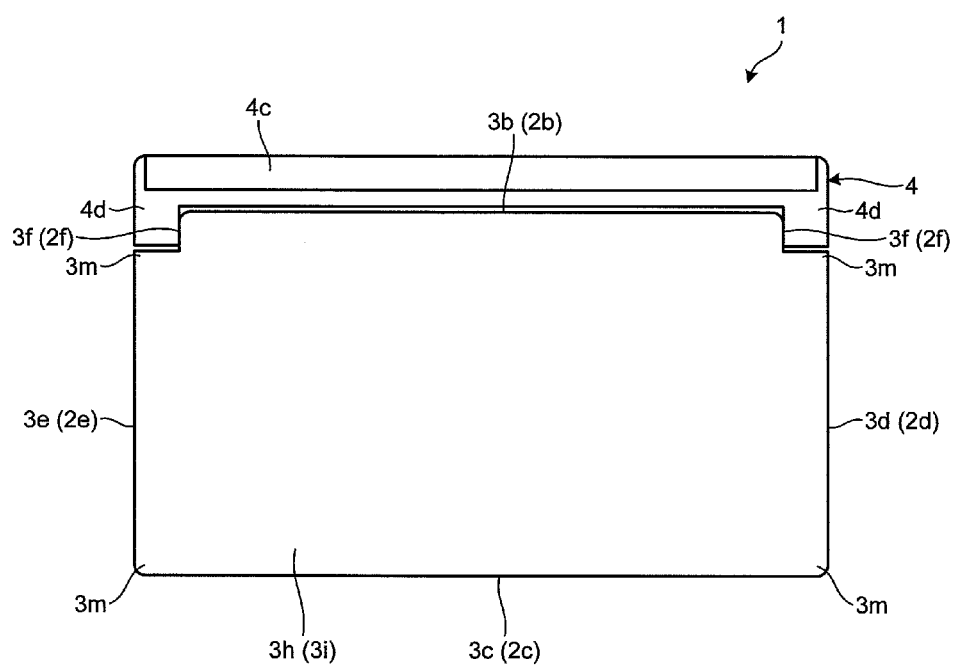
FIG. 6 is an exemplary plan view of the electronic device in the folded position in the first embodiment.

In the first embodiment, as illustrated in FIG. 6, the connector 4 comprises: a base (base portion, long portion, first portion) 4c; and protrusions (end, second portion) 4d, 4d. The base 4c opposes the end portion 2b of the first housing 2 and the end portion 3b of the second housing 3 with a spacing therebetween, and is extended along the end portions 2b, 3b. Furthermore, as illustrated in FIG. 2 and the like, the base 4c is extended in a direction away from the end portions 2b, 3b. As illustrated in FIG. 6, one of the protrusions 4d, 4d is extended from one end of the base 4c in the longitudinal direction of the base 4c toward the end portions 2c, 3c of the first and second housings 2, 3 along end portions (side portions) 2d, 3d of the first and second housings 2, 3. Further, the other one of the protrusions 4d, 4d is extended from the other end of the base 4c in the longitudinal direction of the base 4c toward the end portions 2c, 3c of the first and second housings 2, 3 along end portions (side portions) 2e, 3e of the first and second housings. Each of the end portions 2d, 2e is provided with a recess (cutout portion, region, space) 2f having a cutout shape corresponding to each of the two protrusions 4d, 4d. Further, each of the end portions 3d, 3e is provided with a recess (cutout portion, region, space) 3f having a cutout shape corresponding to each of the two protrusions 4d, 4d. In the first embodiment, two hinge mechanisms 5 independent of each other are provided, and each of the hinge mechanisms is housed in one of the two protrusions 4d, 4d. In the first embodiment, predetermined rigidity is provided for the connector 4 and the end portions 2b, 3b, thereby the rotations at each of the two hinge mechanisms (see FIG. 5) are maintained the same.

As illustrated in FIGS. 1, 3, and the like, the first housing 2 comprises, as a wall: a front wall 2g forming the face 2a as a front face; a back wall 2i (see FIG. 5) forming a face 2h as a back face; and a periphery wall (side wall) 2k forming a face 2j as a side face. The front wall 2g is provided with a rectangular opening (penetrating portion, hole) 2n. A display panel 6 is provided inside the housing 2 as a display module (display device, module). The display panel 6 can be configured as, for example, a liquid crystal display (LCD), an organic electroluminescent display (OELD), or the like. A display screen (screen, display face) 6a, which is a portion of a front face of the display panel 6, is exposed through the opening 2n. The housing 2 comprises four corners 2m. Two of the four corners 2m positioned at a side of the end portion 2b (back end) are provided with the recesses 2f, 2f, respectively. The protrusions 4d, 4d of the connector 4 are housed in the recesses 2f, 2f, respectively.

Further, as illustrated in FIGS. 1, 3, and the like, the second housing 3 comprises, as a wall: a front wall 3g forming the face 3a as a front face; a back wall 3i (see FIG. 5) forming a face 3h as a back face; and a periphery wall (side wall) 3k forming a face 3j as a side face. The front wall 3g is provided with a rectangular opening (penetrating portion, hole) 3n. A display panel 6 is provided inside the housing 3 as a display module (display device, module). The display panel 6 can be configured as, for example, a liquid crystal display (LCD), an organic electroluminescent display (OELD), or the like. A display screen (screen, display face) 6a, which is a portion of a front face of the display panel 6, is exposed through the opening 3n. The housing 3 comprises four corners 3m. Two of the four corners 3m which are located on a side of the end portion 3b (back end) are provided with recesses 3f, 3f, respectively. The protrusions 4d, 4d of the connector 4 are housed in the recesses 3f, 3f, respectively.

As illustrated in FIGS. 1, 3, and the like, in the present embodiment, the opening 2n of the first housing 2 is extended over a region (protruding portion) between the recesses 2f, 2f, at the end portion 2b. An edge 2p of the opening 2n at the side of the end portion 2b is positioned close to the end portion 2b (positioned at the side of the edge portion (periphery portion, corner) 2q provided as a portion of a periphery portion along the periphery of the face 2a). The opening 3n of the second housing 3 is extended over a region (protruding portion) between the recesses 3f, 3f at the end portion 3b. An edge 3p of the opening 3n at the side of the end portion 3b is positioned close to the end portion 3b (positioned at the side of the edge portion (periphery portion, corner) 3q provided as a portion of a periphery portion along the periphery of the face 3a). That is to say, in the present embodiment, the openings 2n, 3n are located near each other. Thus, as illustrated in FIGS. 1, 3, and the like, when the electronic device 1 is in the unfolded (opened) position, an undisplayable zone (no-display zone, no-display section, no-display width) between the display screen 6a of the first housing 2 and the display screen 6a of the second housing 3 can be narrowed down (can be decreased in size). Consequently, even when a single continuous video image (still image, moving image) is to be displayed over both of the display screens 6a, 6a, a misalignment of the single video image on the two display screens 6a, 6a can be reduced.

A thin touch panel unit 7 is provided on a side of the front face of each of the display panel 6, as an input operation module. The touch panel unit 7 is configured to detect the contact state or a distance (or change in the distance) of a finger, a stylus, or the like on the front face side. The touch panel unit 7 is configured to be clear. Thus, the light of the video image displayed on the display screen 6a is emitted to the front face side through the touch panel unit 7. A user (operator) sees this light as the video image.

On faces (front face, periphery face) 2a, 3a around the openings 2n, 3n exposed when the electronic device 1 is in the unfolded position, there may be provided, for example, a button (power button, click button, and the like), a pointing device configured to move a selection region such as a cursor or the like within the display screen 6a, and the like. Further, on the faces 2a, 3a, there may be provided, for example, an input module 9 such as a camera (imaging module) and a microphone (audio input module), an output module 10 such as a lamp and a light emitting diode (LED), and the like.

As described above, in the present embodiment, the touch panel unit 7 is provided on the front face side of each of the display panels 6. Thus, almost the entire areas of the display screens 6a, 6a in the openings 2n, 3n, can be an input operation module. Here, as illustrated in FIGS. 1, 2, and the like, the electronic device 1 of the present embodiment can be used in a position (one of first placed modes) where one of the first housing 2 and the second housing 3 (for example, the first housing 2) is placed on a flat plane P (placement face, see FIG. 2), while the other one of the first housing 2 and the second housing 3 (for example, second housing 3) is raised from the one of the first housing 2 and the second housing 3. In this case, an image representing a text input portion (such as, for example, a keyboard image, a frame image surrounding a text, and an image (not illustrated) of an element corresponding to the text) is displayed on the display screen 6a of the one of the first housing 2 and the second housing 3 (placed housing, first housing 2), by automatic or manual operation.

The placed modes where the one of the first housing 2 and the second housing 3 is placed on the flat plane P (placement face) comprises: (1) a mode (one of the first placed modes, see FIGS. 1, 2, and the like) where the first housing 2 is a placed portion (flatly placed portion, horizontal portion) while the second housing 3 is the raised portion (vertical portion); and (2) a mode (other one of the first placed modes, not illustrated) where the second housing 3 is the placed portion and the first housing 2 is the raised portion. The electronic device 1 can be configured so as to be used in either of the modes (orientations). However, if for some reasons a particular one of the modes (for example, the mode (1)) is preferred as the placed mode, an indication (for example, design, image, symbol, text, and the like) 11 can be attached to the faces 2a, 3a. Here, the indication represents this mode, i.e., direction of the electronic device 1. The indication 11 may be a logo, a name of product, a name of manufacture, and the like. As illustrated in FIG. 4, the electronic device 1 can be used in (3) a mode where the other one of the first housing 2 and the second housing 3 which is not the placed portion is not raised so that the other one of the first housing 2 and the second housing 3 is placed on the flat plane P (placement face) (second placed mode).

Further, the electronic device 1 of the present embodiment can be used in: (4) a mode (one of third placed modes, see FIG. 7) where the end portion 2d of the first housing 2 and the end portion 3d of the second housing 3 are placed on the flat plane P (placement face); and (5) a mode (other one of the third placed modes, not illustrated) where the end portion 2e of the first housing 2 and the end portion 3e of the second housing 3 are placed on the flat plane P (placement face).

In the present embodiment, the connector 4 comprises a contact portion 4f (see FIGS. 1 and 2) and a contact portion 4g (see FIG. 7) on an opposite side of the contact portion 4f. The contact portion 4f extends along the end portions 2d, 3d in a direction away from the end portions 2b, 3b, and comes in contact with the flat plane P (placement face) when the electronic device 1 is used in the mode (4). The contact portion 4g is extended along the end portions 2e, 3e in a direction away from the end portions 2b, 3b, and comes into contact with the flat plane P (placement face) when the electronic device 1 is used in the mode (5). In the present embodiment, the connector 4 is extended to the back side of the display screen 6a. Thus, a base portion is extended along the flat plane P (placement face) in three directions from the end portions 2b, 3b. Thus, in comparison to the case when no connector 4 is provided, the electronic device 1 can be placed more stably even in the third placed modes (4) and (5). Because of the connector 4, the electronic device 1 can be prevented from falling backward when it is used in the third placed modes.

As illustrated in FIG. 5 and the like, in the present embodiment, a protrusion (extended portion, wall) 2r extended outward from the periphery of the back wall 2i, which is the wall located opposite the display screen 6a, is provided at the end portions 2d, 2e located at the sides in the width direction of the first housing 2. Further, a protrusion (extended portion, wall) 3r extended from the periphery of the back wall 3i, which is the wall located opposite the display screen 6a, is provided at the end portion 3d, 3e located at the sides in the width direction of the second housing 3. In the third placed mode (4) or (5) (see FIG. 7), the protrusions 2r, 3r come into contact with the flat plane P (placement plane), together with the contact portions 4f or 4g. Therefore, in comparison to the case when the protrusions 2r, 3r are not provided, the impact on the display panel 6 when the electronic device 1 is placed on top of the desk or the like can be reduced, so that the display panel 6 is protected even better. Furthermore, since the display panel 6 can be located away from the placement face such as the desk surface for the amount of protrusions 2r, 3r, liquid such as water spilled onto the flat plane P of the placement face and the like of the desk and the like hardly touches the display panel 6. Besides, the protrusions 2r, 3r are also provided at the end portions 2c, 3c of the front end side. Thus, it becomes easy to open (unfold) the first housing 2 and the second housing 3 from the folded position (closed position) because a user can hook his/her finger or the like on the protrusions 2r, 3r. In the present embodiment, the protrusion 2r is provided at the three end portions 2c, 2d, 2e other than the end portion 2b of the first housing 2, and the protrusion 3r is provided at the three end portions 3c, 3d, 3e other than the end portion 3b of the second housing 3.

Figure 7:
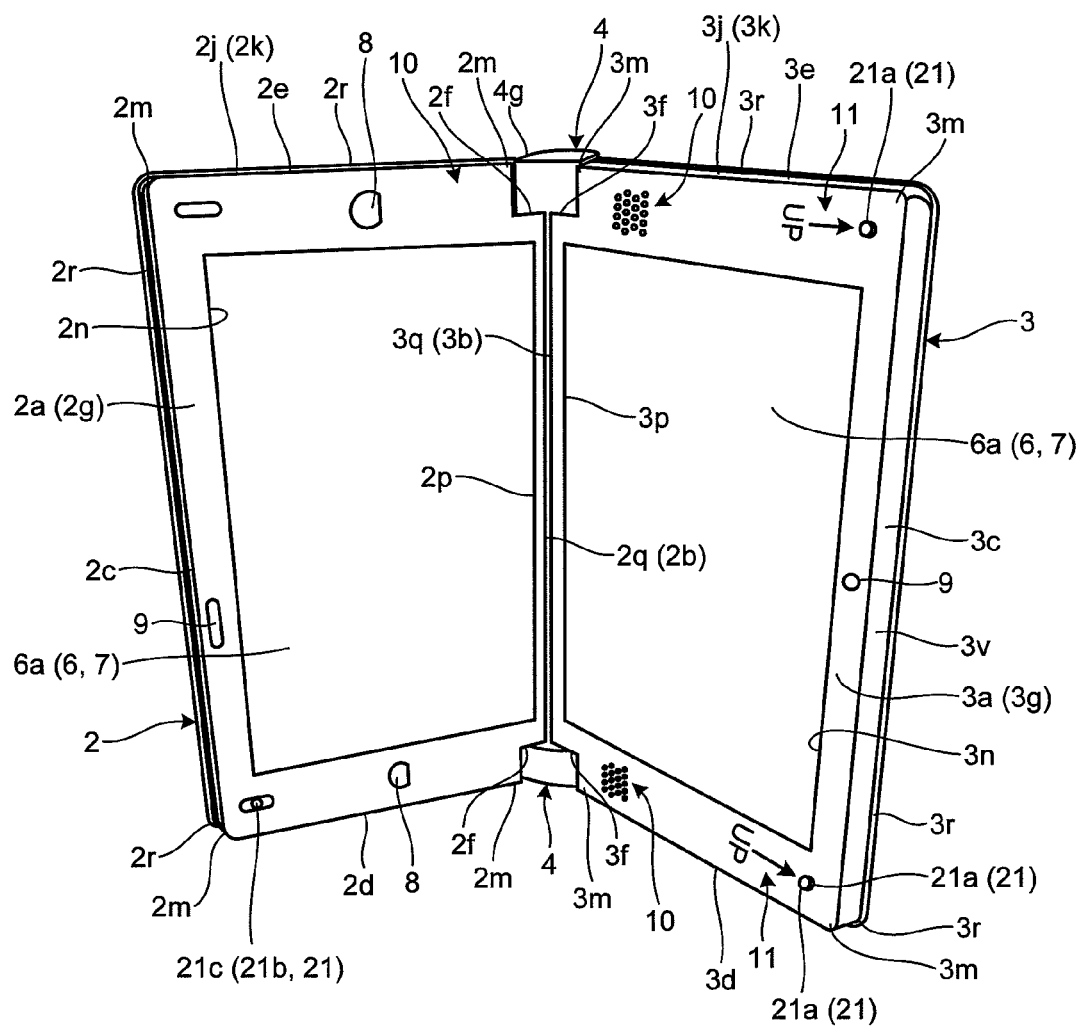
FIG. 7 is an exemplary perspective view of the electronic device in the unfolded position, from another point of view, in the first embodiment.

Further, according to the embodiment, in a mode (6) where the electronic device 1 is held such that the first housing 2 and the second housing 3 are horizontally (right and left) placed next to each other (first handheld mode) as illustrated in FIG. 7, the user can hold the connector 4 extended (protruding) at the back side from the end portions 2b, 3b, as a handle (grip, holding portion). Thus, the user can hold the electronic device 1 by his/her finger and the like, without touching the display screen 6a. It becomes easier for the user to hold the electronic device 1.

On the other hand, in the present embodiment, in a mode (7) where the electronic device 1 is held such that the first housing 2 and the second housing 3 are vertically (up and down) placed next to each other (second handheld mode) as illustrated in FIG. 3, the user can hold the end portions 2c, 2d, 2e, 3c, 3d, 3e of the first housing 2 or the second housing 3, as a handle (grip, holding portion). In the present embodiment, at the end portions 2c, 2d, 2e, 3c, 3d, 3e, the periphery of the display panel 6 (openings 2n, 3n) is separated from the periphery of the corresponding faces 2a, 3a. Thus, when the user holds the end portions 2c, 2d, 2e, 3c, 3d, 3e of the electronic device 1 by his/her finger and the like, it is less likely that his/her finger and the like touches the display screen 6.

Figure 8:
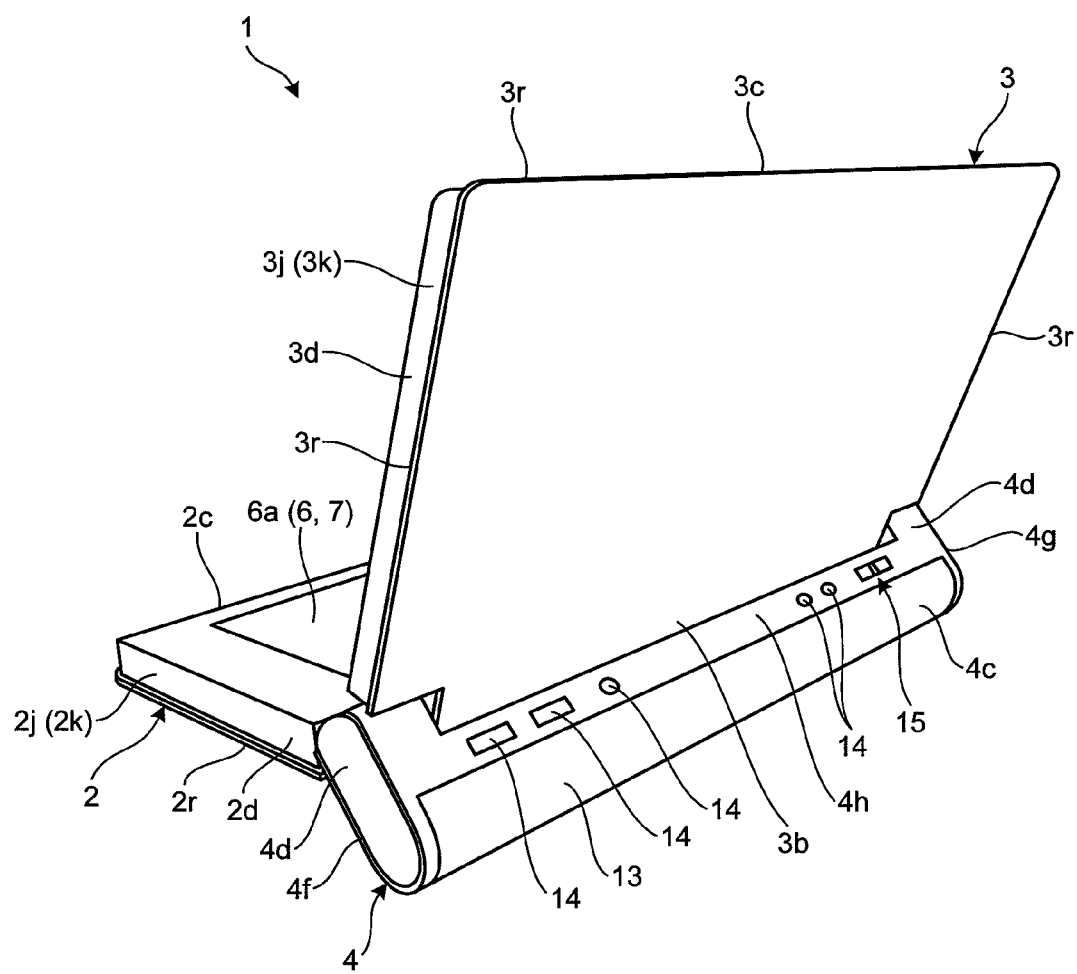
FIG. 8 is another exemplary perspective view of the electronic device in the unfolded position, from another point of view, in the first embodiment.

As illustrated in FIG. 8, in the present embodiment, an exterior face (face) 4h of the connector 4 may be provided with: a connector link portion 14 (for example, an alternating current (AC) adapter connector, a universal serial bus (USB) connector, a card connector, and the like) into which an external connecter is inserted; and an operation portion 15 (input operation portion) such as an operation button (push button) or a switch. The link portion 14 and the operation portion 15 are preferred to be provided at a portion of the exterior face 4h such as a portion to be maintained exposed in each of the modes (in particular, in the placed modes (1), (2), and the like) and a portion to be easily exposed.

A battery 13 which is a power source for operating the electronic device 1 can be mounted in (held by, housed by, attached to) the connector 4. The battery 13 can be configured attachable/detachable with respect to the connector 4. In the present embodiment, the connector 4 is extended along the end portions 2b, 3b; therefore, it is easier to mount a comparatively long and large capacity battery 13.

Figure 9:
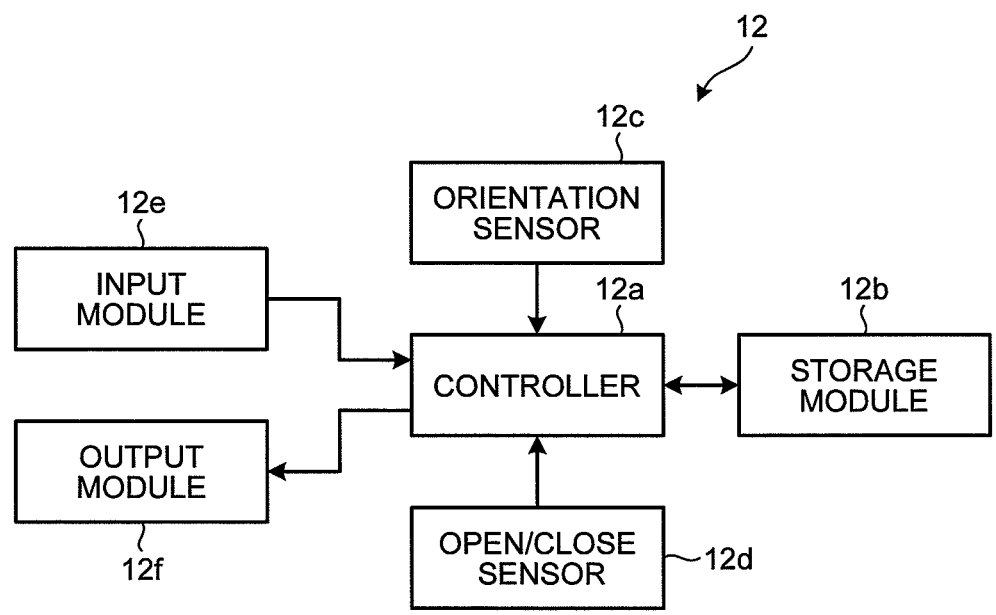
FIG. 9 is an exemplary block diagram of a control circuit of the electronic device in the first embodiment.

A circuit board, an electronic component, and/or the like not illustrated is housed in at least one of the first housing 2 and the second housing 3, and configures a control circuit 12 as illustrated in FIG. 9. In the present embodiment, the control circuit 12 comprises: a controller 12a; a storage module 12b; a orientation sensor 12c; an open/close sensor 12d; an input module 12e; an output module 12f; and the like. The controller 12a is configured as, for example, a central processing unit (CPU), and controls the output module 12f based on the result of the detection of orientation by the orientation sensor 12c, the input result by the input module 12e, and/or the like. The orientation sensor 12c is configured as, for example, an acceleration sensor or the like, and configured to detect the orientation of the electronic device 1. The open/close sensor 12d is configured as, for example, a contact sensor, a pressure sensor, a contact-free sensor (magnetic sensor), or the like, and configured to detect the open/closed position, the open/closed state, the relative position, the angle, and/or the like, of the first housing 2 and the second housing 3. The input module 12e is configured as, for example, the touch panel unit 7, the input modules 8, 9 described above, and/or the like. The output module 12f is configured as, for example, the display panel 6, the output module 10 described above, and/or the like. The controller 12a is one example of the display controller, and the input module 12e (input module 8) is one example of the input operation module. The control circuit 12 is provided with a controller (not illustrated) and/or the like.

The hinge mechanism 5 rotates one of the edge portion 2q (first periphery portion) and an edge portion 3q (second periphery portion) with respect to other one of the edge portion 2q and the edge portion 3q in a manner such that the edge portion 2q and the edge portion 3q are spaced apart from each other but adjacent to each other (the one of the edge portion 2q and the edge portion 3q is arranged near (closed to) the other one of the edge portion 2q and the edge portion 3q). The hinge mechanism 5 comprises: a shaft 24a (connecting portion, fixing portion, attaching portion) as a first portion connected to the first housing 2; and a shaft 25a (connecting portion, fixing portion, attaching portion) as a second portion connected to the second housing 3. The hinge mechanism 5 rotatably connects the first housing 2 and the second housing 3 via each portion and/or component. The hinge mechanism 5 permits a change in the distance between the shaft 24a and the shaft 25a during the rotation of the first housing 2 and the second housing 3 with respect to each other, so as to prevent a change in the distance between the edge portion 2q and the edge portion 3q (between the end portions 2b, 3b).

In FIGS. 10 to 13, one example of the hinge mechanism 5 of the present embodiment is illustrated. The hinge mechanism 5 comprises a first component 24 connected to the first housing 2 and a second component 25 connected to the second housing 3. The first component 24 comprises the shaft 24a fixed to the first housing 2 and an arm (protruding portion, rotating portion) 24b fixed to the shaft 24a. The second component 25 comprises a shaft 25a fixed to a second housing 3 and an arm (protruding portion, rotating portion) 25b fixed to the shaft 25a.

In the present embodiment, ends (portion distant from the shafts 24a, 25a) of the arms 24b, 25b are rotatably connected with each other via a cylindrical (round-bar like) connecting member (shaft bearing, axis member, intervening member, shaft) 26. Thus, in the present embodiment, the center of axis of a connecting member 26 is an axis of rotation Ax of the first housing 2 and the second housing 3. The position of the connecting member 26 is at a connecting position Cp between the first component 24 and the second component 25. The shaft 24a and the shaft 25a are one example of the protruding portion protruding in a direction along the edge portions 2q, 3q from the first housing 2 and the second housing 3. The shaft 24a and the shaft 25a are arranged parallel with respect to each other. The arm 24b comprises two arms 24b which are arranged distant from each other in the longitudinal direction of the shaft 24a (direction of protrusion). Further, the arm 25b comprises two arms 25b which are arranged distant from each other in the longitudinal direction of the shaft 25a (direction of protrusion). The connecting member 26 bridges over the two arms 24b, 24b and the two arms 25b, 25b, and both ends thereof are supported by the arms 24b, 24b and arms 25b, 25b.

In the present embodiment, the connecting position Cp (connecting member 26) is arranged nearer to the edge portions 2q, 3q than to the shafts 24a, 25a. In particular, the connecting position Cp (connecting member 26, rotational axis Ax) is arranged lateral to (out-of-paper direction in FIGS. 10 to 13) ends 2qa, 3qa of the edge portions 2q, 3q in a direction along the edge portions 2q, 3q. In the unfolded position according to FIG. 10, the rotational axis Ax is positioned distant from the faces 2a, 3a of the first and second housings 2, 3 by the height which is half of the spacing between the edge portions 2q, 3q, with respect to the center of the spacing. Thus, as illustrated in FIGS. 10 to 13, the edge portion 2q rotates around the portion edge portion 3q, and accordingly, the first housing 2 and the second housing 3 rotates around the rotational axis Ax positioned near the edge portions 2q, 3q.

Figure 10:
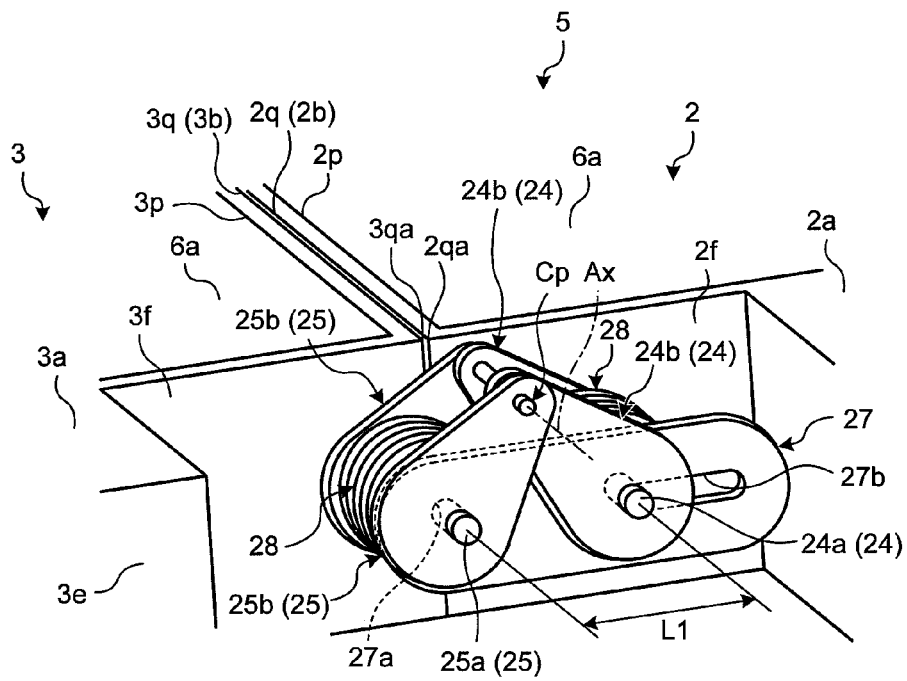
FIG. 10 is an exemplary perspective view of a hinge mechanism comprised in the electronic device in which two housings are unfolded with respect to each other, in the first embodiment.
Figure 11:
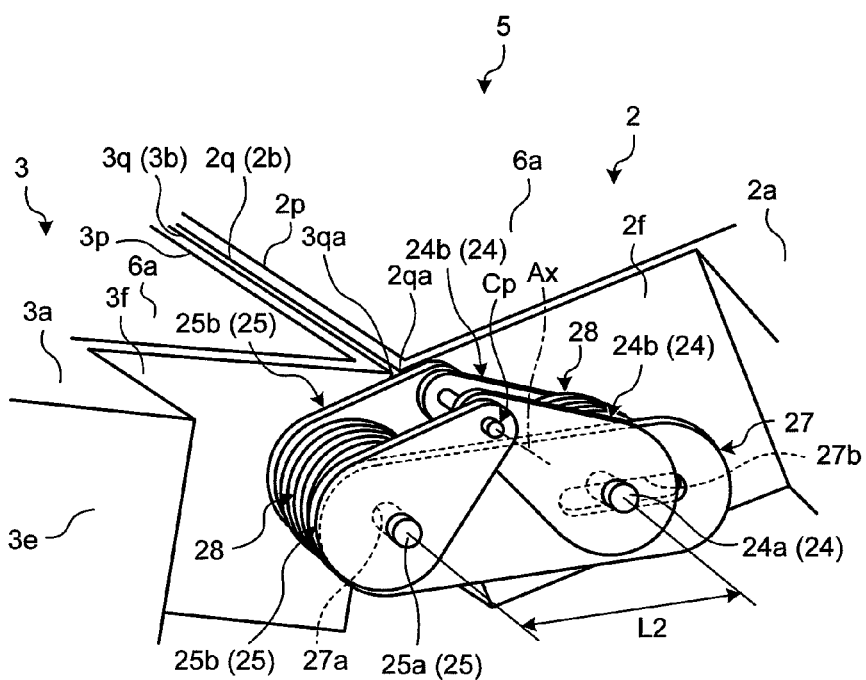
FIG. 11 is an exemplary perspective view of the hinge mechanism comprised in the electronic device in which the two housings are moved closer to each other than the position in FIG. 10, in the first embodiment.
Figure 12:
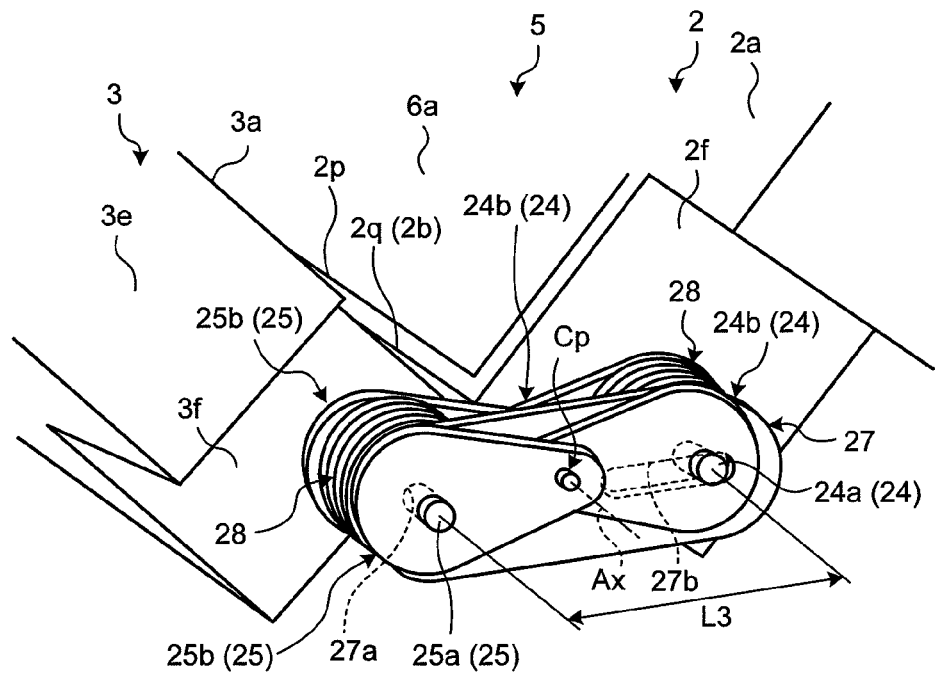
FIG. 12 is an exemplary perspective view of the hinge mechanism comprised in the electronic device in which the two housings are moved closer to each other than the position in FIG. 11, in the first embodiment.
Figure 13:
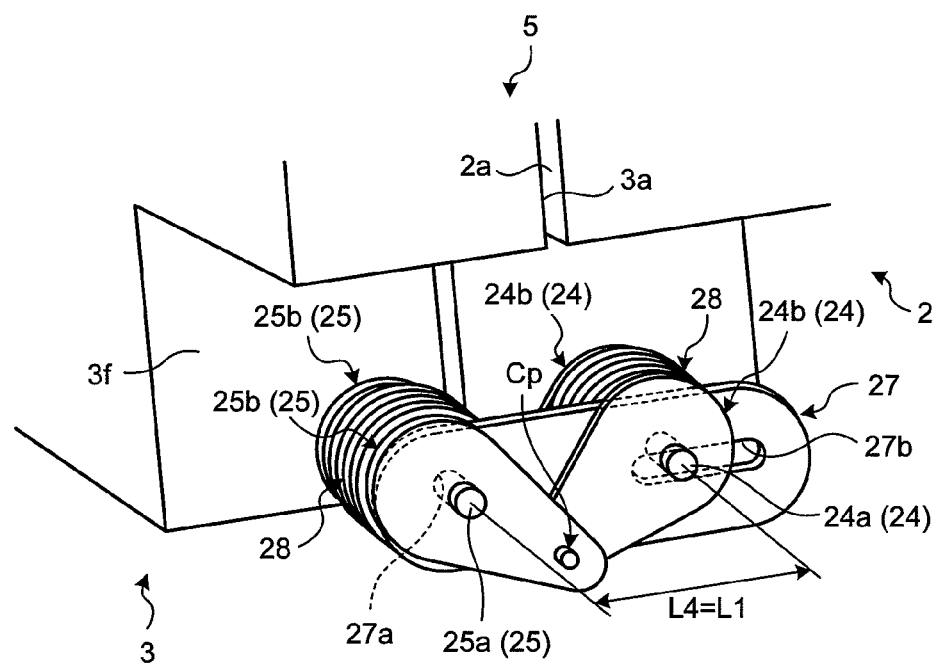
FIG. 13 is an exemplary perspective view of the hinge mechanism comprised in the electronic device in which the two housings are folded with respect to each other in the first embodiment.
Figure 14:
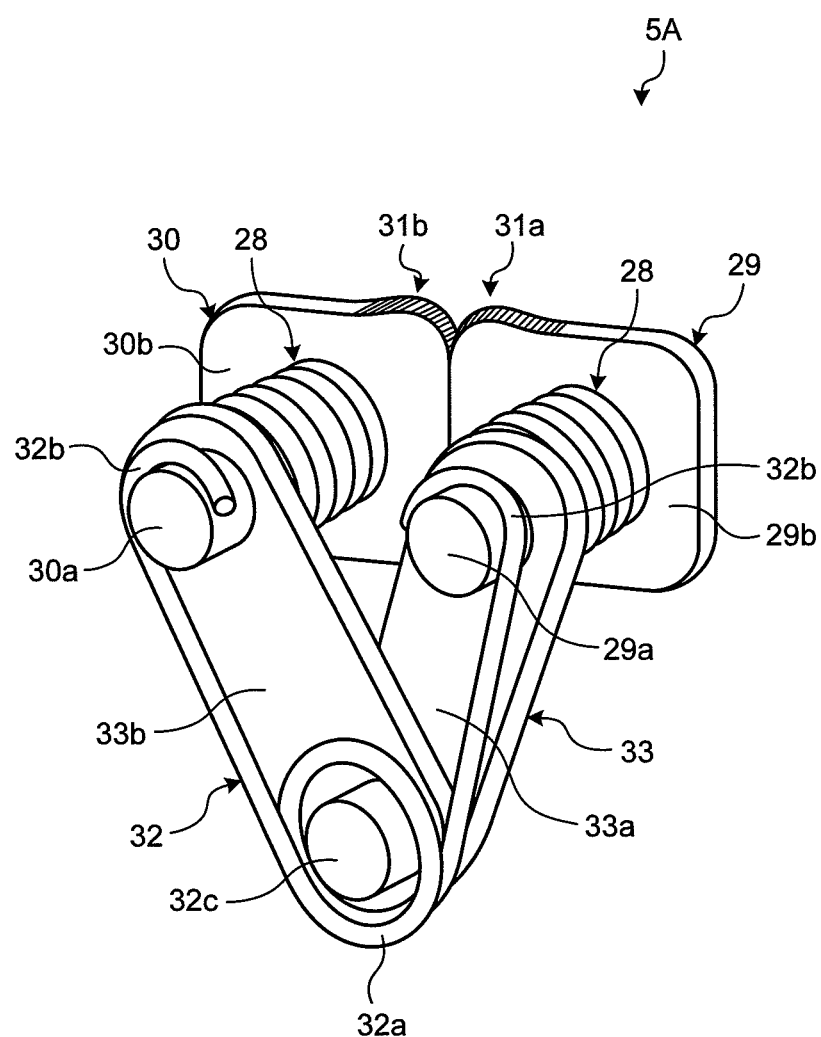
FIG. 14 is an exemplary perspective view of a hinge mechanism comprised in an electronic device according to a second embodiment.

With reference to FIGS. 10 to 13, it can be understood that, in the hinge mechanism 5, the distance between the shafts 24a, 25a changes among L1 to L4 such that the distance becomes short, long, then short. That is to say, the distance L2 between the shafts 24a, 25a of the electronic device 1 in the position (FIG. 11) where the first housing 2 and the second housing 3 are bit more closed than that of the electronic device 1 in the unfolded position (see FIG. 4) where the angle between the first housing 2 and the second housing 3 is at 180° as illustrated in FIG. 10 is longer than the distance L1 between the shafts 24a, 25a of the electronic device 1 in the unfolded position illustrated in FIG. 10. Further, the distance L3 between the shafts 24a, 25a of the electronic device 1 in the position (FIG. 12) where the first housing 2 and the second housing 3 are bit more closed than that of the electronic device 1 in the position illustrated in FIG. 11 is longer than the distance L2 between the shafts 24a, 25a of the electronic device 1 in the position illustrated in FIG. 11. The distance between the shafts 24a, 25a becomes the maximum when the angle between the first housing 2 (face 2a, display screen 6a, or the like) and the second housing 3 (face 3a, display screen 6a, or the like) becomes the right angle (90°). The distance between the shafts 24a, 25a becomes shorter as the angle decreases from the angle at which the distances between the shafts 24a, 25a is at the maximum. As illustrated in FIG. 13, the distance L4 between the shafts 24a, 25a of the electronic device 1 in the folded position (see FIG. 5) where the angel between the first housing 2 and the second housing 3 is at 0° is the same as the distance L1 between the shafts 24a, 25a of the electronic device 1 in the unfolded position where the angle between the first housing 2 and the second housing 3 is at 180° as illustrated in FIG. 10. By the configuration and the operation of the aforementioned hinge mechanism 5, the edge portion 3q rotates around the edge portion 2q while the edge portion 3q is spaced apart from the edge portion 2q but adjacent to the edge portion 2q. The first housing 2 and the second housing 3 are rotated relative to each other; therefore, when the edge portion 3q rotates around the edge portion 2q, the edge portion 2q rotates around the edge portion 3q.

The hinge mechanism 5 of the present embodiment comprises: a third component 27 rotatably supported by or connected to the first component 24 and the second component 25; and a resist element 28 provided between the third component 27 and the first component 24 and between the third component 27 and the second component 25.

The third component 27 is configured as, for example, a comparatively long and thin plate-like member. On one side of the third component 27 in the longitudinal direction thereof, there is provided a through hole (circular hole, opening, supporting hole) 27a through which the shaft 25a penetrates. On the other side of the third component 27, there is provided a long hole-like opening (through hole, slit, groove, guide) 27b through which the shaft 24a penetrates. The opening 27b extends along the longitudinal direction of the third component 27. The third component 27 is rotatably supported by the shaft 25a, and also rotatably supported as well as movably supported along the opening 27b by the shaft 24a. As is clear from FIGS. 10 to 13, the third component 27 and the first component 24 as well as the third component 27 and the second component 25 rotates relative to each other in accordance with the rotation of the first housing 2 and the second housing 3.

The resist element (contact element, friction element, holding element) 28 is formed by, for example, layering a plurality of ring-like disk springs through which the shafts 24a, 25a penetrate. The resist element 28 is provided between the third component 27 and the first component 24 as well as between the third component 27 and the second component 25. That is to say, one of the resist elements 28 is in contact with the third component 27 and the first component 24, and sandwiched therebetween. Other one of the resist element 28 is in contact with the third component 27 and the second component 25, and sandwiched therebetween. The two resist elements 28, 28 each generates elastic repulsive force (pressing force), and causes frictional drag between the first component 24 and the third component 27, between the second component 25 and the third component 27, between the first component 24 and the second component 25, and between the first housing 2 and the second housing 3. As described above, in the present embodiment, the frictional drag can be caused between the first housing 2 and the second housing 3 by the configuration comprising the third component 27 and the resist element 28. Here, the resist element 28 can be provided to one of the shafts 24a, 25a.

In the present embodiment, there is provided an engaging mechanism 21 to prevent misalignment between the first housing 2 and the second housing 3. As illustrated in FIG. 1 and the like, the engaging mechanism 21 comprises: a protrusion 21a provided to the second housing 3; and a receiving portion 21b provided to the first housing 2 and comprising a recess 21c for receiving the protrusion 21a. The protrusion 21a is an example of a second engaging portion, and the receiving portion 21b is one example of a first engaging portion. In the present embodiment, the protrusion 21a and the receiving portion 21b forming the engaging mechanism 21 are provided at the ends (both ends) of the end portions 2c, 3c at the front ends of the first housing 2 and the second housing 3. The protrusion 21a and the receiving portion 21b engage with each other in the direction intersecting the rotational axis Ax. In the present embodiment, the face 2a of the first housing 2 and the face 3a of the second housing 3 can be placed so as to oppose each other with a spacing therebetween, by the engagement of the protrusion 21a and the receiving portion 21b. However, the spacing can be provided between the face 2a of the first housing 2 and the face 3a of the second housing 3 by the protrusion and recess configuration of other portions or the like.

Furthermore, if the protrusion 21a is provided to one of the first housing 2 and the second housing 3 which is the placed housing to be placed on the flat plane P (placement face) while one of the modes (for example, the aforementioned mode (1)) is desired as the placed mode for some reasons, user's finger or the like can easily interfere with the protrusion 21a. Thus, it is preferred that the protrusion 21a is provided on the placed housing (for example, first housing 2) and the receiving portion 21b is provided to the raised housing (for example, second housing 3). In this case, the controller 12a as the display controller displays an image (not illustrated) representing the input portion (for example, image of the keyboard, image of frame surrounding text, image of element corresponding to text, and/or the like) of the text on the display screen 6a of the placed housing (for example, the first housing 2). Accordingly, by setting the resistive force of resist mechanisms 16A, 16B to differ from each other, the placed housing and the raised housing can be defined easily. That is to say, as described above, the resistive force of the resist mechanism 16A is set to be larger than the resistive force of the resist mechanism 16B so that the state of the hinge mechanism 5 illustrated in FIG. 12 and the state of the electronic device 1 illustrated in FIG. 13, or in other words, the state where the first housing 2 is the placed housing and the second housing 3 is the raised housing can easily be obtained. As a result, it is unlikely that the user's finger interfere with the protrusion 21a.

In the present embodiment, the side walls (periphery wall) 2k, 3k of the sides of the end portions 2c, 3c comprise portions (concaves) 2v (see FIG. 1), 3v (see FIG. 7) curved and depressed toward inside the first housing 2 and the second housing 3. The portions 2v, 3v form a continuous curved face (side face) where the portion of the opposing faces 2a, 3a is the bottom. Consequently, when the user opens the first housing 2 and the second housing 3, the user can easily hook his/her finger on the side walls (periphery wall) 2k, 3k at the side of the end portions 2c, 3c at the front end side.

As described above, in the present embodiment, the hinge mechanism 5 as the connector connects the first housing 2 and the second housing 3 with each other so that the first housing 2 and the second housing 3 is rotatable with respect to each other while one of the edge portion 2q as the first periphery portion and the edge portion 3q as the second periphery portion is spaced apart from but adjacent to other one of the edge portion 2q and the edge portion 3q. Further, in the present embodiment, when the first housing 2 and the second housing 3 are rotated with respect to each other, the hinge mechanism 5 permits the change in the relative distance between the shaft 24a as the first portion and the shaft 25a as the second portion, so as to prevent the change in the distance between the edge portion 2q as the first periphery portion and the edge portion 3q as the second periphery portion, during the rotation. Therefore, the peripheries (edge portions 2q, 3q) can be maintained close to each other, independently of the angle between the first housing 2 and the second housing 3.

Further, in the present embodiment, the position Cp at which the first component 24 and the second component 25 are connected with each other is positioned nearer to the edge portions 2q, 3q than the shaft 24a as the first portion and the shaft 25a as the second portion. Thus, the change in the distance (increase in the spacing) between the edge portions 2q, 3q during the rotation of the first housing 2 and the second housing 3 with respect to each other can be suppressed by comparatively simple configuration. Still further, in the embodiment, the position Cp is positioned lateral to the edge portions 2q, 3q with respect to the ends 2qa, 3qa of the edge portions 2q, 3q. Thus, the change in the distance (increase in the spacing) between the edge portions 2q, 3q can be prevented even more.

Still further, in the present embodiment, the hinge mechanism 5 and the position Cp is arranged on at least one of the recesses 2f, 3f provided at the corners 2m, 3m of the first and second housings 2, 3. Thus, the position Cp can be positioned closer to the edge portions 2q, 3q (on the extended lines thereof).

In FIGS. 14 to 18, one example of a hinge mechanism 5A according to a second embodiment is illustrated. Also in the hinge mechanism 5A of the second embodiment, the edge portion 2q as the first periphery portion and the edge portion 3q as the second periphery portion are rotated with respect to each other, while the edge portion 2q and the edge portion 3q are spaced apart from but adjacent to each other. The hinge mechanism 5A comprises: a shaft (connecting portion, fixing portion, attaching portion) 29a as the first portion connected to the first housing 2; and a shaft (connecting portion, fixing portion, attaching portion) 30a as the second portion connected to the second housing 3. The hinge mechanism 5A rotatably connects the first housing 3 and the second housing 3 with each other, via each portion and component. The hinge mechanism 5A is configured to permit, while the first housing 2 and the second housing 3 are rotated with respect to each other, a change in a distance between the shafts 29a, 30a, so as to prevent a change in a distance between the edge portions 2q, 3q (between the end portions 2b, 3b). The hinge mechanism 5A according to the present embodiment may be equipped to the electronic device 1 as an alternative for the hinge mechanism 5. Configurations other than the hinge mechanism 5A of the electronic device 1 according to the present embodiment are similar to that of the first embodiment, therefore the explanations thereof are omitted.

The hinge mechanism 5A comprises: a first component 29 connected to the first housing 2; and a second component 30 connected to the second housing 3. The first component 29 comprises: the shaft 29a fixed to the first housing 2; and a cam (contact portion, touching portion, pressing portion, positioning portion) 29b fixed to the shaft 29a. The cam 29b extends in a radial direction of the shaft 29a. The second component 30 comprises: the shaft 30a fixed to the second housing 3; and a cam (contact portion, a touching portion, a pressing portion, a positioning portion) 30b fixed to the shaft 30a. The cam 30b extends in a radial direction of the shaft 30a. The cam 29b rolls around the cam 30b while contact regions 31a, 31b are maintained in contact with each other. That is to say, the cam 30b rolls around the cam 29b while the contact regions 31a, 31b are maintained in contact with each other. The cam 29b is one example of the first contact portion, and the cam 30b is one example of the second contact portion.

In the present embodiment, the hinge mechanism 5A comprises a coil spring (elastic element, bias element, pressing element) 32 as a pushing element for pushing the first component 29 and the second component 30 against each other. In the present embodiment, the coil spring 32 is used as a torsion spring. The coil spring 32 comprises: a winding portion 32a as a middle portion; and hooks 32b, 32b as two ends at the both sides of the middle portion. The coil spring 32 generates force on the shafts 29a, 30a via the hooks 32b, 32b in a direction toward which the shafts 29a, 30a are prevented from being separated from each other. Thus, the cams 29b, 30b are pushed against each other by the coil spring 32, and the distance between the cams 29b, 30b, between the first component 29 and the second component 30, and further between the first housing 2 and the second housing 3 are prevented from being separated with respect to each other.

At in-contact areas (touched areas, fitted areas, engaged areas, pressed areas, exterior periphery, periphery) 31a, 31b where the cams 29b, 30b are in contact with each other, a concave/convex shape is formed along in a direction toward which the shafts 29a, 30a extend. When the in-contact areas 31a, 31b of the cams 29b, 30b are made in contact with each other, the in-contact areas 31a, 31b comes in contact with each other so that the misalignment of the cams 29b, 30b in the radial direction can be prevented. The shafts 29a, 30a are one example of the protrusions protruding in the direction along the edge portions 2q, 3q from the first and second housings 2, 3. The shafts 29a, 30a are arranged in parallel with respect to each other. In the present embodiment, the in-contact areas 31a, 31b are positioned closer to the edge portions 2q, 3q than the shafts 29a, 30a. The concave-convex shape is one example of a slip preventing element.

Figure 15:
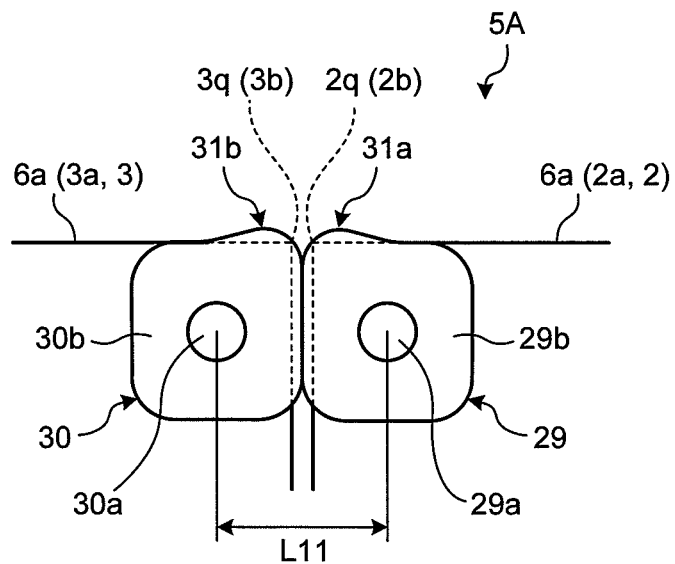
FIG. 15 is an exemplary side view of the hinge mechanism comprised in the electronic device in which two housings are unfolded with respect to each other, in the second embodiment.
Figure 16:
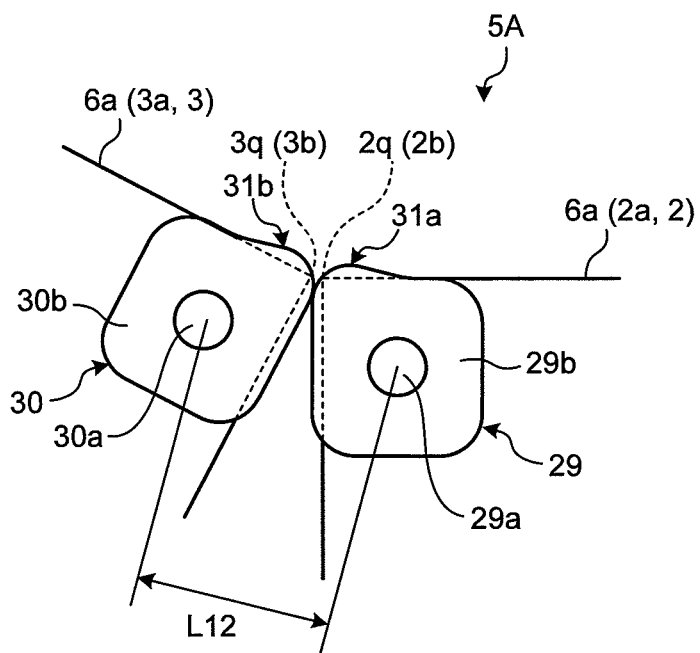
FIG. 16 is an exemplary side view of the hinge mechanism comprised in the electronic device in which the two housings are moved closer to each other than the position in FIG. 15, in the second embodiment.
Figure 17:
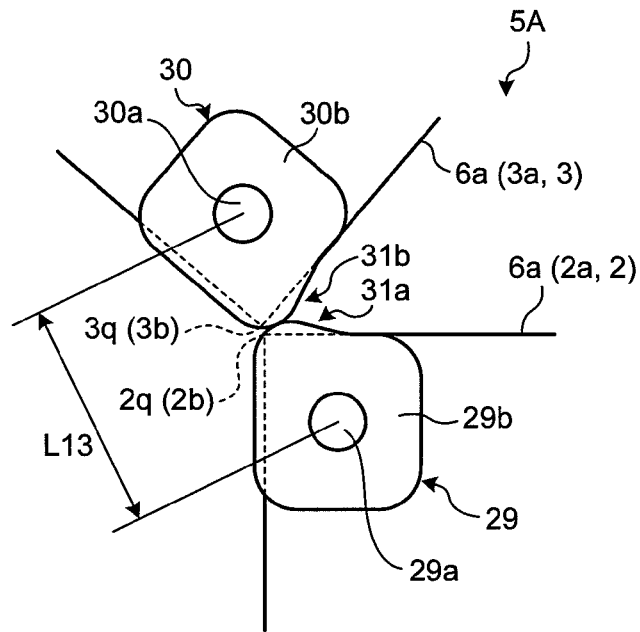
FIG. 17 is an exemplary side view of the hinge mechanism comprised in the electronic device in which the two housings are moved closer to each other than the position in FIG. 16, in the second embodiment.
Figure 18:
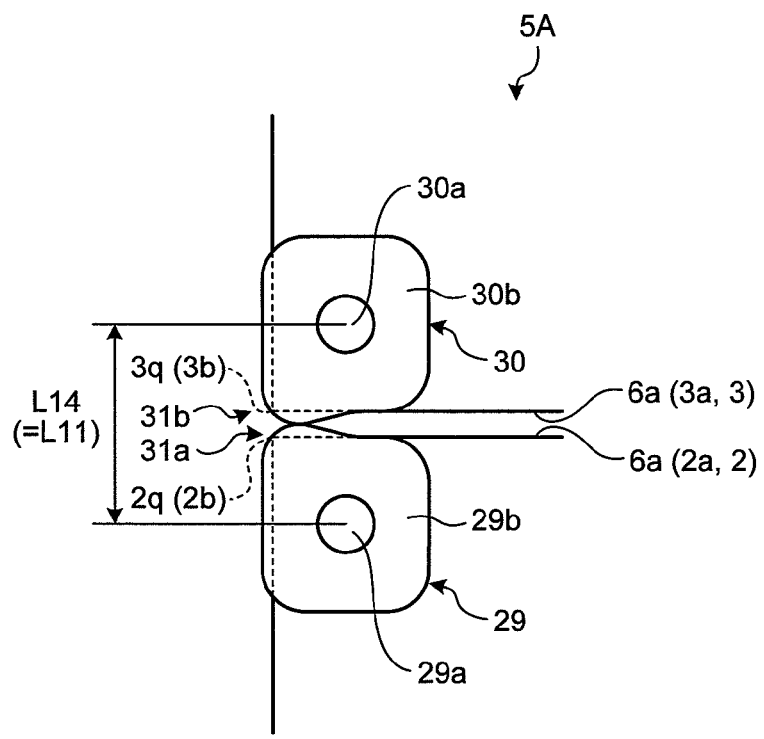
FIG. 18 is an exemplary side view of the hinge mechanism comprised in the electronic device in which the two housings are folded with respect to each other, in the second embodiment.

As illustrated in FIGS. 15 to 18, in the hinge mechanism 5A of the aforementioned configuration, a contact position and a contact orientation at the in-contact areas 31a, 31b of the cams 29b, 30b change according to the rotation of the first housing 2 and the second housing 3. That is to say, the first housing 2 and the second housing 3 rotate with respect to each other in accordance with the shape (profile) of the cams 29b, 30b. As can be understood from FIGS. 15 to 18, in the hinge mechanism 5A of the present embodiment, a distance between the shafts 29a, 30a changes among L11 to L14 such that the distance becomes short, long, then short. That is to say, the distance L12 between the shafts 29a, 30a of the electronic device 1 in the position (FIG. 16) where the first housing 2 and the second housing 3 are bit more closed than that of the electronic device 1 in the unfolded position (see FIG. 4) where the angel between the first housing 2 and the second housing 3 is at 180° as illustrated in FIG. 15 is longer than the distance L11 between the shafts 29a, 30a of the electronic device 1 in the unfolded position as illustrated in FIG. 15. Further, the distance L13 between the shafts 29a, 30a of the electronic device 1 in the position (FIG. 17) where the first housing 2 and the second housing 3 are bit more closed than that of the electronic device 1 in the position illustrated in FIG. 16 is longer than the distance L12 between the shafts 29a, 30a of the electronic device 1 in the position illustrated in FIG. 16. The distance (L11 to L14) between the shafts 29a, 30a becomes the maximum when the angle between the first housing 2 (face 2a or display screen 6a thereof) and the second housing 3 (face 3a or display screen 6a) is almost at the right angle (90°). When the angle is decreased from the angle at which the distance between the shafts 29a, 30a is at the maximum, the distance between the shafts 29a, 30a gradually decreases. As illustrated in FIG. 18, the distance L14 between the shafts 29a, 30a of the electronic device 1 in the folded position (see FIG. 5) where the angle between the first housing 2 and the second housing 3 is 0° is the same as the distance L11 between the shafts 29a, 30a of the electronic device 1 in the position where the angle between the first housing 2 and the second housing 3 is 180° as illustrated in FIG. 15. By the configuration and the operation of the aforementioned hinge mechanism 5A, the edge portion 3q rotates around the edge portion 2q while the edge portion 3q is spaced apart from the edge portion 2q but adjacent thereto. Here, the rotation of the first housing 2 and the second housing 3 is relative. That is to say, when the edge portion 3q rotates around the edge portion 2q, the edge portion 2q also rotates around the edge portion 3q.

The profiles (shapes) at the in-contact areas 31a, 31b of the cams 29b, 30b are the mirror image of each other. That is to say, the profiles are symmetric. Generally, the profiles match with the shapes of the end portions 2b, 3b (edge portions 2q, 3q) of the first housing 2 and the second housing 3. However, in order to avoid sudden change in the orientation of the electronic device 1 during the rotation, the profiles are formed in a convex shape curved outward from the housing at the portion corresponding to the edge portions 2q, 3q. Thus, the profiles at the portion corresponding to the edge portions 2q, 3q are formed smoothly. Further, over the entire in-contact areas 31a, 31b, the profiles are positioned outside of the face 2a which is the front face of the first housing 2 and the second housing 3 and from the face 2j which is the side face, when viewed from the side as in FIGS. 15 to 18 and the like. Consequently, the interference between the first housing 2 and the second housing 3 can be suppressed.

The hinge mechanism 5A according to the present embodiment comprises: a third component 33 movably supported by or connected to the first component 29 and the second component 30; and a resist element 28 provided between the third component 33 and the first component 29 and between the third component 33 and the second component 30.

The third component 33 is configured as, for example, a link arm comprising comparatively thin and long plate-like arms 33a, 33b rotatably connected with each other at a connecting point 33c. Due to the change in the angle between the arms 33a, 33b, the third component 33 expands and contracts in accordance with the change in the distance between the shafts 29a, 30a. In accordance with the rotation of the first housing 2 and the second housing 3 with respect to each other, the arms 33a, 33b and the first component 29 and the arms 33a, 33b and the second component 30 rotate relative to each other.

The resist elements (contact element, frictional element, holding element) 28, 28 are similar to that of the first embodiment. The resist elements 28, 28 are provided between the arm 33a and the first component 29 and between the arm 33b and the second component 30. That is to say, one of the resist elements 28, 28 is made in contact with the arm 33a and the first component 29, and sandwiched therebetween. Further, other one of the resist element 28, 28 is made in contact with the arm 33b and the second component 30, and sandwiched therebetween. The two resist elements 28, 28 each provides elastic repulsive force (pressing force) so that frictional drag is caused between the arm 33a and the first component 29, between the arm 33b and the second component 30, between the first component 29 and the second component 30, and between the first housing 2 and the second housing 3. As described above, in the present embodiment, the frictional drag can be caused between the first housing 2 and the second housing 3 by the configuration to comprise the third component 33 and the resist element 28.

Figure 19:
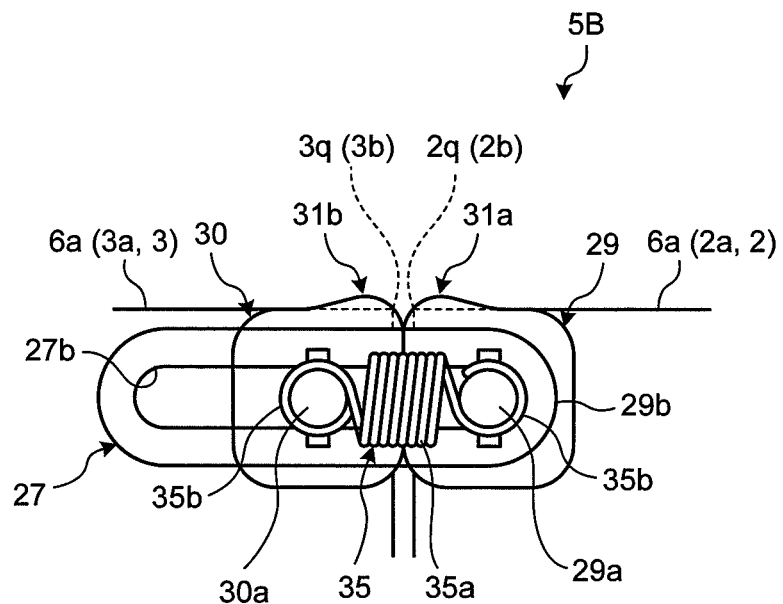
FIG. 19 is an exemplary side view of the hinge mechanism comprised in the electronic device according to a modification of the second embodiment.
Figure 20:
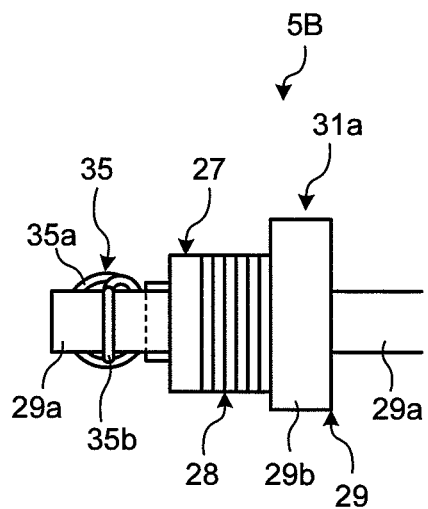
FIG. 20 is an exemplary front view of the hinge mechanism comprised in the electronic device of the modification.

One example of a hinge mechanism 5B according to a modification of the second embodiment is illustrated in FIGS. 19 and 20. In the modification, configurations and arrangements of cams 29b, 30b are the same as that of the second embodiment. Thus, the first housing 2 and the second housing 3 operates in a manner similar to that of the second embodiment, via the hinge mechanism 5B. Further, the hinge mechanism 5B according to the modification may be equipped to the electronic device 1 as an alternative for the hinge mechanism 5 according to the first embodiment. That is to say, configurations of the present embodiment other than the hinge mechanism 5B of the electronic device 1 are the same as that of the first embodiment, thereby the explanations thereof are omitted.

In the present modification, the hinge mechanism 5B comprises: a third component 27 which is similar to that of the first embodiment; and resist elements 28, 28 provided between the third component 27 and a first component 29 and between the third component 27 and a second component 30 which are similar to that of the first embodiment. Thus, operations by the third component 27 and the resist elements 28, 28 are the same as that of the first embodiment.

However, in the present modification, a coil spring 35 which is a pull spring is used. That is to say, the coil spring 35 comprises: a winding portion 35a positioned between the shafts 29a, 30a; and hooks 35b, 35b provided at both ends in the longitudinal direction of the winding portion 35a. The hooks 35b, 35b are hooked on the shafts 29a, 30a, respectively. The coil spring 35 generates force against the shafts 29a, 30a via the hooks 35b, 35b in a direction preventing the shafts 29a, 30a to be separated away from each other. Thus, by the coil spring 35, the cams 29b, 30b are pressed against each other, thereby a cam 19a and the cam 30b, the first component 29 and the second component 30, and further the first housing 2 and the second housing 3 can be prevented from being spaced apart.

Figure 21:
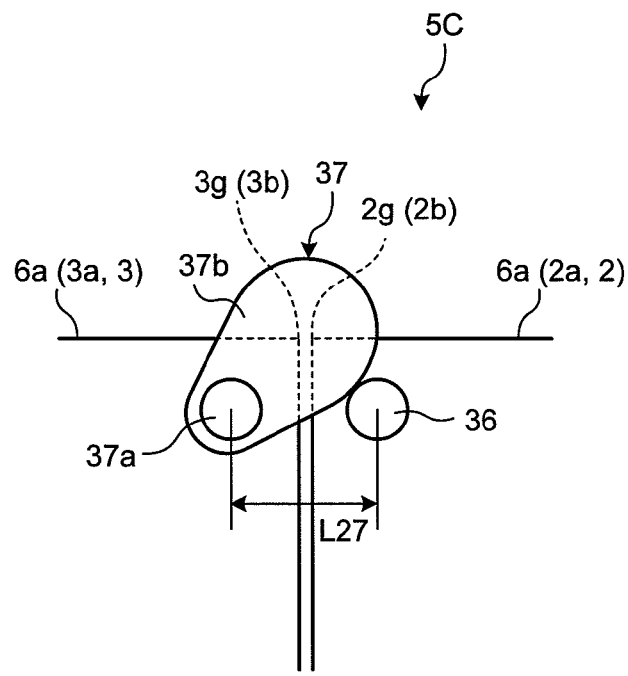
FIG. 21 is an exemplary side view schematically illustrating a hinge mechanism comprised in an electronic device in which two housings are unfolded with respect to each other, according to a third embodiment.
Figure 22:
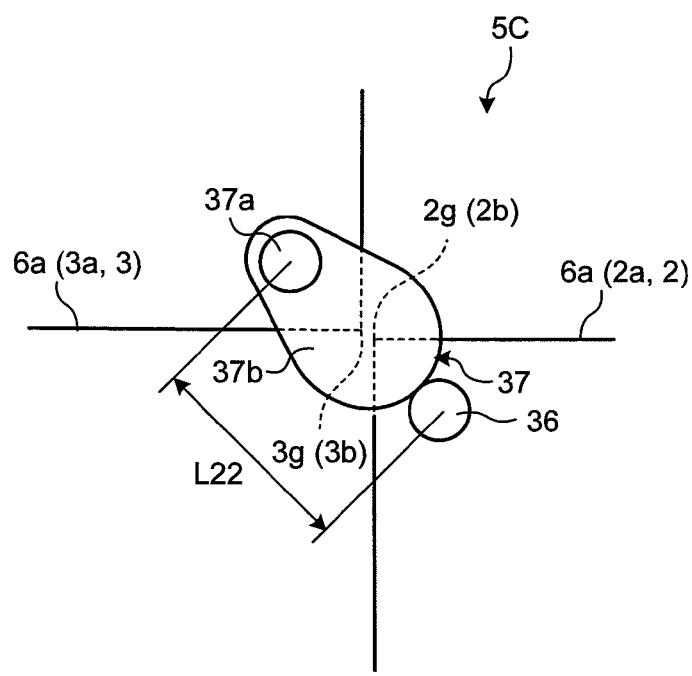
FIG. 22 is an exemplary side view schematically illustrating the hinge mechanism comprised in the electronic device in which the two housings are moved closer to each other than the position in FIG. 21, in the third embodiment.
Figure 23:
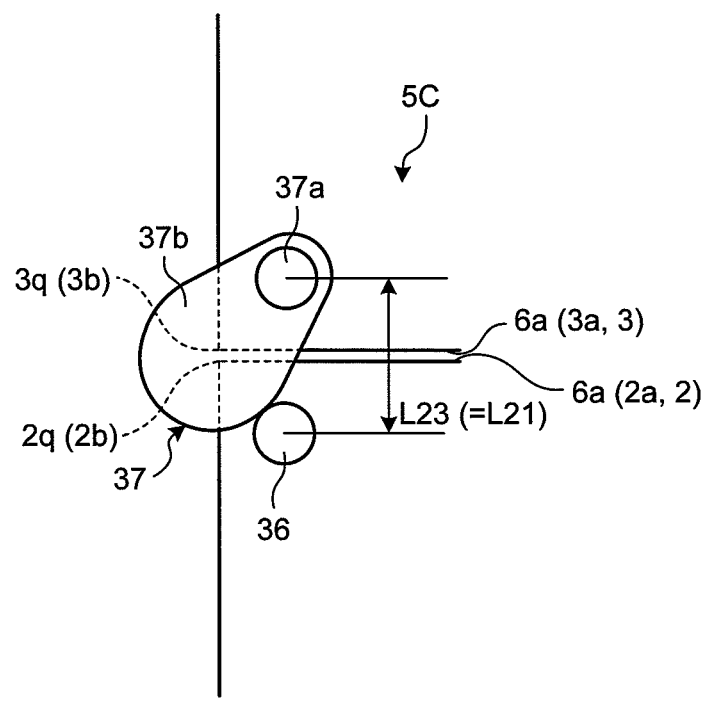
FIG. 23 is an exemplary side view schematically illustrating the hinge mechanism comprised in the electronic device in which the two housings are folded with respect to each other, in the third embodiment.

A hinge mechanism 5C according to a third embodiment is illustrated in FIGS. 21 to 23. The hinge mechanism 5C according to the present embodiment generally has configurations similar to that of the second embodiment, and comprises: a first component 36 configured as a first contact portion and a shaft; a cam 37b which is a second contact portion made in contact with the first component 36 and rolling around the first component 36; and a pushing mechanism not illustrated. That is to say, in the present embodiment, the first component 36 configured as the shaft is used as a cam. Thus, profiles of the first component 36 and the cam 37b differ from each other. The pushing mechanism may be configured as similar to that of the second embodiment, and pushes the first component 36 as the shaft and a shaft 37a of a second component 37 against each other.

By appropriately setting the profile of the cam 37b, by the hinge mechanism 5C of the present embodiment, one of the edge portion 2q as the first periphery portion and the edge portion 3q as the second periphery portion is rotated around other one of the edge portions 2q, 3q while the edge portions 2q, 3q are spaced apart from but adjacent to each other. The hinge mechanism 5C comprises: the first component (connecting portion, fixing portion, attaching portion) 36 as the first portion connected to the first housing 2; and a shaft (connecting portion, fixing portion, attaching portion) 37a as the second portion connected to the second housing 3. Then, the hinge mechanism 5C rotatably connects between the first housing 2 and the second housing 3 via each portion and component. Further, during the rotation of the first housing 2 and the second housing 3, the hinge mechanism 5C permits a change in a distance between the first component 36 and the shaft 37a to be changed, thereby preventing a change in a distance between the edge portions 2q, 3q (end portions 2b, 3b). The hinge mechanism 5C according to the present embodiment can be equipped to the electronic device 1 as an alternative for the hinge mechanism 5 according to the first embodiment. That is to say, the configurations other than the hinge mechanism 5C of the electronic device 1 according to the present embodiment may be configured as similar to that of the first embodiment. Thus, the explanations thereof are omitted.

As illustrated in FIGS. 21 to 23, in accordance with the rotation of the first housing 2 and the second housing 3, the contact position and the contact orientation of the cam 37b and the first component 36 changes. That is to say, the first housing 2 and the second housing 3 rotates with respect to each other in accordance with a shape (profile) of the cam 37b. As can be understood from FIGS. 21 to 23, in the hinge mechanism 5C, the distance between the first component 36 and the shaft 37a changes among the distances L21 to L23 such that the distances becomes short, long, then short. Even in the present embodiment, the distance L23 between the first component 36 and the shaft 37a of the electronic device 1 in the folded position (see FIG. 5) where the angle between the first housing 2 and the second housing 3 is at 0° as illustrated in FIG. 23 is the same as the distance L21 between the first component 36 and the shaft 37a of the electronic device 1 in the unfolded position where the angle between the first housing 2 and the second housing 3 is at 180° as illustrated in FIG. 21. By the aforementioned configurations and the operations of the hinge mechanism 5C, the edge portion 3q rotates around the edge portion 2q while the edge portion 3q is spaced apart from but adjacent to the edge portion 2q. Here, the rotation of the first housing 2 and the second housing 3 is relative. Thus, when the edge portion 3q rotates around the edge portion 2q, the edge portion 2q rotates around the edge portion 3q. According to the present embodiment, only one cam 37b is enough, thereby the loads during production can be reduced.

Figure 24:
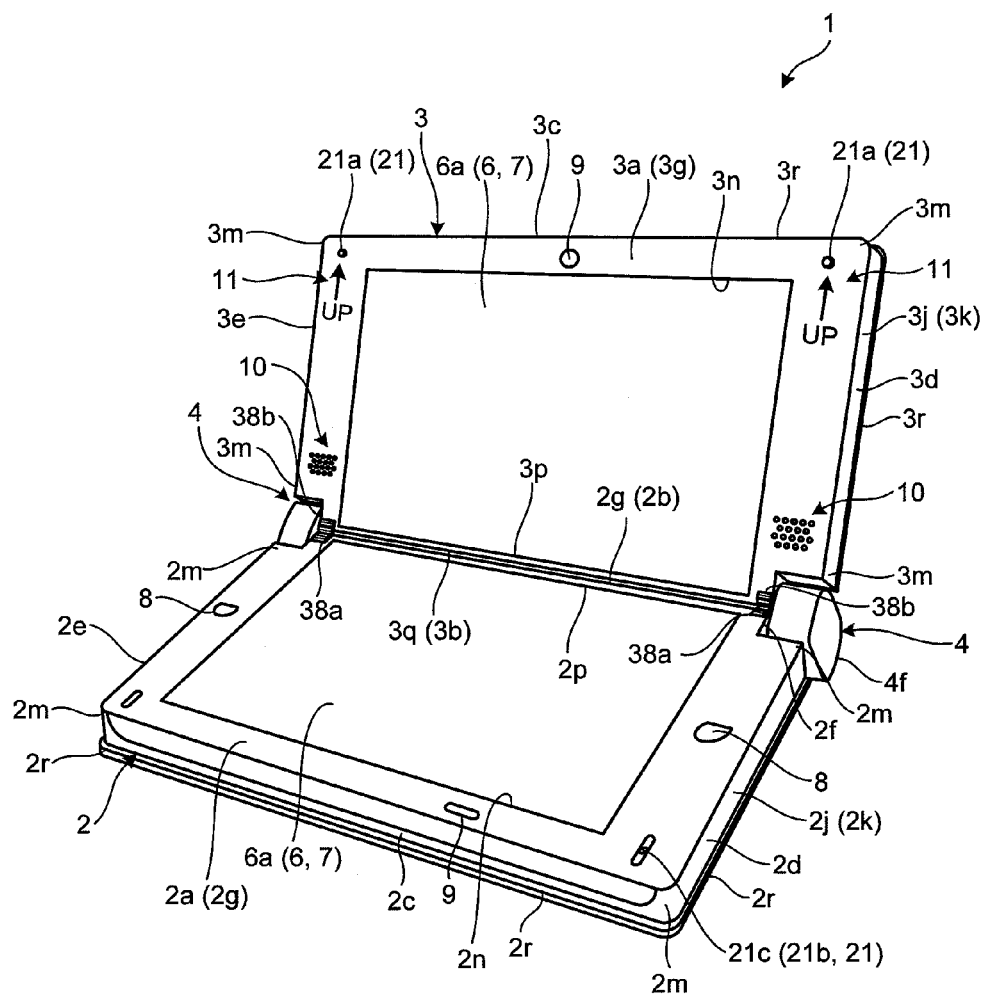
FIG. 24 is an exemplary perspective view of an electronic device in an unfolded position according to a fourth embodiment.

In a fourth embodiment illustrated in FIG. 24, a cam 38a as the first contact portion is provided over between the face (front face) 2a and the face (side face at the base end side) 2j (not illustrated in FIG. 24) intersecting with each other at the edge portion 2q of the first housing 2, and a cam 38b as the second contact portion is provided over between the face (front face) 3a and the face (side face on a base end side) 3j (not illustrated in FIG. 24) intersecting with each other at the edge portion 3q of the second housing 3. The configurations of the present embodiment are similar to that of the second embodiment, except that the first contact portion and the second contact portion (cams 38a, 38b) are different, thus the effect similar to that of the second embodiment is obtained. According to the present embodiment, the cams 38a, 38b are provided to the first housing 2 and the second housing 3, thereby sizes of the configurations of the hinge mechanism (not illustrated) inside the connector 4 can be reduced and the configurations can be simplified. The connector 4 houses therein: a first portion (first component not illustrated) configured as the shaft and the like connected to the first housing 2; a second portion (second component not illustrated) configured as the shaft and the like connected to the second housing 3; and a pushing mechanism (not illustrated) such as a coil spring and the like biasing the first portion and the second portion with respect to each other in a direction pushing the cams 38a, 38b against each other.

Figure 25:
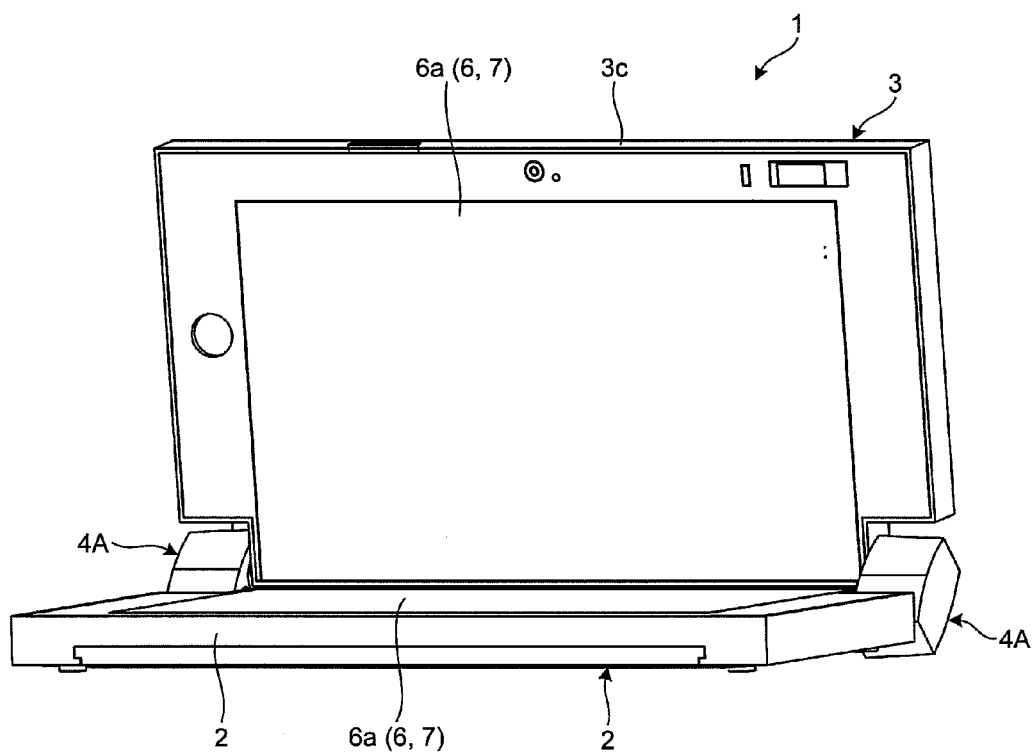
FIG. 25 is an exemplary perspective view of the electronic device in the unfolded position according to a modification of the first embodiment.

While certain embodiments have been described, these embodiments have been presented by way of example only, and are not intended to limit the scope of the inventions. Thus, various modifications thereof can be made. For example, as in a modification illustrated in FIG. 25, a connector 4A of an electronic device 1 may comprise (two) separate configuration elements arranged at both end sides. In this case, the hinge mechanism (not illustrated) is housed in each of the connectors 4A.

Further, the embodiments can be applied to other electronic devices such as a mobile phone, a smartphone, a smartbook, an electronic book terminal, a personal digital assistant (PDA), a game machine, and the like. The above embodiments may also be applied to electronic devices comprising first and second housings only one of which is provided with a display screen. Besides, the specification (number, form, structure, location, arrangement, shape, size, thickness, motion range, material, connection object, etc.) of the electronic device or the first housing, the second housing, the first display device, the second display device, the first portion, the second portion, the first component, the second component, the third component, the contact element, the pushing element, the first contact portion, the second contact portion, the slip preventing element, the exterior face, and the module, can be modified.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic device comprising:
 a first display comprising a first screen;
 a first housing comprising a first face and a first edge portion, the first housing configured to house the first display, the first face configured to expose the first screen through a first opening, the first edge portion located along a periphery of the first face;
 a second display comprising a second screen;
 a second housing comprising a second face and a second edge portion, the second housing configured to house the second display, the second face configured to expose the second screen through a second opening, the second edge portion located along a periphery of the second face and extending parallel with the first edge portion near the first edge portion;

a hinge mechanism comprising a first connector connected to the first housing and a second connector connected to the second housing, the hinge mechanism configured to rotatably connect the first housing and the second housing, the hinge mechanism further configured to change a distance between the first connector and the second connector when the first housing rotates with respect to the second housing to maintain a distance between the first edge portion and the second edge portion within a first distance in a state that the first edge portion and the second edge portion are parallel with each other when the first housing rotates with respect to the second housing;

a first recess at a first end of the first edge portion of the first housing; and a second recess at a second end of the second edge portion of the second housing, wherein at least a part of the first connector is housed in the second recess, and at least a part of the second connector is housed in the first recess.

2. An electronic device comprising:
a first housing comprising:
- a first face, and
- a first edge portion located along a periphery of the first face;

a second housing comprising:
- a second face, and
- a second edge portion located along a periphery of the second face and extending parallel with the first edge portion near the first edge portion; and a hinge mechanism configured to connect a first connector connected to the first housing and a second connector connected to the second housing and rotatably connect the first housing and the second housing, the hinge mechanism further configured to change a distance between the first connector and the second connector when the first housing rotates with respect to the second housing to maintain a distance between the first edge portion and the second edge portion within a first distance in a state that the first edge portion and the second edge portion are parallel with each other when the first housing rotates with respect to the second housing.

3. The electronic device of claim 2, wherein
the first housing comprises a first end portion and a first module positioned at the first end portion.

4. The electronic device of claim 3, wherein
the second housing comprises a second end portion facing the first end portion and a second module positioned at the second end portion.

5. The electronic device of claim 2, wherein
at least a part of the second connector is housed in a first cutout portion of the first housing, and
at least a part of the first connector is housed in a second cutout portion of the second housing.

6. The electronic device of claim 2, wherein
the first connector and the second connector are rotatably connected at a position between the first edge portion and the second edge portion and above the first face and the second face in an unfolded state that the first face and the second face are side by side and facing a same side when viewed in a longitudinal direction of the first edge portion or the second edge portion.

* * * * *